US012675047B2

(12) United States Patent
Nagasawa et al.

(10) Patent No.: US 12,675,047 B2
(45) Date of Patent: Jul. 7, 2026

(54) CONDUCTIVE POLYMER COMPOSITION, COATED PRODUCT, AND PATTERNING PROCESS

(71) Applicant: SHIN-ETSU CHEMICAL CO., LTD., Tokyo (JP)

(72) Inventors: Takayuki Nagasawa, Joetsu (JP); Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 678 days.

(21) Appl. No.: 17/989,816

(22) Filed: Nov. 18, 2022

(65) Prior Publication Data

US 2023/0168584 A1 Jun. 1, 2023

(30) Foreign Application Priority Data

Nov. 26, 2021 (JP) ................................ 2021-191721

(51) Int. Cl.

| | |
|---|---|
| ***G03F 7/09*** | (2006.01) |
| ***C09D 5/24*** | (2006.01) |
| ***C09D 7/45*** | (2018.01) |
| ***C09D 7/65*** | (2018.01) |
| ***C09D 139/02*** | (2006.01) |
| ***C09D 179/02*** | (2006.01) |
| ***G03F 7/20*** | (2006.01) |

(52) U.S. Cl.

CPC ............... *G03F 7/093* (2013.01); *C09D 5/24* (2013.01); *C09D 7/45* (2018.01); *C09D 7/65* (2018.01); *C09D 139/02* (2013.01); *C09D 179/02* (2013.01); *G03F 7/2022* (2013.01)

(58) Field of Classification Search

CPC ........................................................ G03F 7/20

See application file for complete search history.

(56) References Cited

U.S. PATENT DOCUMENTS

| | | | |
|---|---|---|---|
| 558,927 | A | 4/1896 | Boyce |
| 5,370,825 | A | 12/1994 | Angelopoulos et al. |
| 2015/0140492 | A1 | 5/2015 | Sawai et al. |
| 2020/0292941 | A1 | 9/2020 | Nagasawa et al. |

FOREIGN PATENT DOCUMENTS

| | | | | |
|---|---|---|---|---|
| EP | 3709081 | A1 * | 9/2020 | ......... C08G 73/0266 |
| JP | 2902727 | B2 | 6/1999 | |
| JP | 2959968 | B2 | 10/1999 | |
| JP | 3154460 | B2 | 4/2001 | |
| JP | 3631910 | B2 | 3/2005 | |
| JP | 2014-009342 | A | 1/2014 | |
| JP | 2017-039927 | A | 2/2017 | |
| JP | 2020-147630 | A | 9/2020 | |
| JP | 2021-21020 | A | 2/2021 | |
| JP | 2021021020 | A * | 2/2021 | |

OTHER PUBLICATIONS

Aug. 20, 2024 Office Action issued in Japanese Patent Application No. 2021-191721.

* cited by examiner

*Primary Examiner* — Chanceity N Robinson

(74) *Attorney, Agent, or Firm* — Oliff PLC

(57) ABSTRACT

A conductive polymer composition containing: (A) a polyaniline-based conductive polymer having a repeating unit represented by following general formula (1); and (B) polymer having structure represented by following general formula (2). In formulae, each of $R^1$ to $R^4$ represents hydrogen atom, acidic group, hydroxy group, alkoxy group, carboxy group, nitro group, halogen atom, or hydrocarbon group, $R^5$ and $R^6$ each independently represent a hydrogen atom, linear, branched, or cyclic alkyl group having 1-10 carbon atoms or a hydrocarbon group containing a hetero atom, $X^{a-}$ represents anion, and "a" represents valence. The conductive polymer composition has good filterability and film-formability of flat film on electron beam resist and can be used suitably for antistatic film for electron beam resist writing showing excellent antistatic property in electron beam writing process, and, reducing effect of acid diffused from film to minimum, and also having excellent peelability.

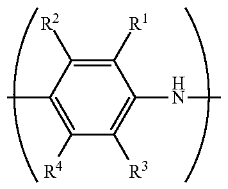

(1)

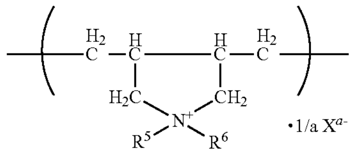

(2)

20 Claims, No Drawings

CONDUCTIVE POLYMER COMPOSITION, COATED PRODUCT, AND PATTERNING PROCESS

TECHNICAL FIELD

The present invention relates to: a conductive polymer composition containing a polyaniline-based conductive polymer; a coated product using the same; and a patterning process using the same.

BACKGROUND ART

In a manufacturing process of a semiconductor device such as an IC, an LSI and the like, fine processing by a lithography method using a photoresist has been conventionally carried out. This is a method in which a substrate is subjected to etching while using a mask having a resist pattern obtained by the results that crosslinking or decomposition reaction of a thin film is induced by irradiation with light to change the solubility of the thin film remarkably, and the film is subjected to development by a solvent and the like. In recent years, accompanied by high integration of semiconductor devices, high-precision fine processing using short-wavelength light beam has come to be required. Development of lithography by an electron beam is being progressed as a next-generation technology owing to its short wavelength characteristics.

Problems peculiar to lithography using an electron beam include charging phenomenon (charge-up) at the time of exposure. This is a phenomenon in which charges accumulate on or in a resist film and become charged when a substrate to be subjected to electron beam exposure is covered with the insulating resist film. Due to this charging, the orbital of the incident electron beam is bent, so that a depicting accuracy is significantly reduced. Therefore, a peelable antistatic film to be applied onto an electron beam resist has been investigated.

In the above-described lithography by the electron beam, accompanied by miniaturization to a generation of less than 5 nm, the positional accuracy of electron beam writing to the electron beam resist has becoming more important. With regard to the writing technology, increasing a current of the conventional technology and MBMW (multi-beam mask writing) and the like are progressing, and it can be expected that a charged state on the resist becomes remarkable so that a conductive polymer having a lower resistivity and a higher charge dissipation ability is desired as a measure for improving the antistatic property of an antistatic film corresponding to development of the writing technology in the future.

In Patent Document 1, it has been disclosed that in order to reduce lowering in writing accuracy on a resist by a charging phenomenon, a conductive polymer film formed by coating the resist with a n-conjugated conductive polymer in which an acidic substituent is introduced in the structure shows an antistatic effect at the time of electron beam writing, and various problems caused by the charging phenomenon, for example, an electrostatic adverse effect on lithography positional accuracy at the time of electron beam irradiation, distortion of the resist pattern and the like, have been solved. It is also clearly shown that the conductive polymer film maintains water solubility even after the electron beam writing by a high irradiation dose so that it is possible to remove the conductive polymer film by washing with water.

Patent Document 2 discloses a composition containing a polyaniline-based conductive polymer, a polyacid, and $H_2O$, and it has been clearly shown that a complex containing the polyaniline-based conductive polymer and the polyacid is capable of forming a good film by spin-coating with 5 to 10 mass %, and can form an antistatic film in which antistatic effect can be observed with a film thickness of 150 nm and peeling and washing with $H_2O$ is possible.

Patent Document 3 discloses an antistatic film use technique of a polythiophene-based conductive polymer for an electron beam lithography, and shows an antistatic film function of a complex containing the polythiophene-based conductive polymer and a polyanion by the effect of adding a gemini type surfactant and the like.

In Patent Document 4, a compound which is subjected to self-doping in a polyaniline molecule has been newly proposed by replacing at least one among H atoms of a benzene ring skeleton of an aniline which is a repeating unit of a polyaniline-based conductive polymer with an acidic group. The polyaniline-based conductive polymer of the above-described Patent Document 2 or 3 is a complex containing an aniline oligomer which is a π-conjugated system polymer that controls carrier transfer, and a monomer or a polymer having a sulfonic acid terminal that is usually called a dopant, and is dispersed in $H_2O$ showing a particle-like behavior therein, so that for subjecting to homogenization of the material, it is necessary to carry out a treatment by a high output homogenizer or a high pressure disperser, and further, after coating an electron beam resist, a process for removing particle aggregates which become a defect of pattern writing is complicated. To the contrary, the compound described in Patent Document 4 is converted into a solvate with $H_2O$ to show molecular behavior, so that the above-described defect factor can be dramatically reduced only by simple filtration.

In Patent Document 5, in paragraphs [0045] to [0048], it has been proposed to add a basic compound to a composition containing a self-doping compound in a polyaniline molecule for the purpose of neutralizing an acid in order to avoid exerting an adverse effect on a resist pattern by interlayer diffusion of an acid existing in a film when the composition is formed into the film on the electron beam resist. As basic compounds, ammonium salts of hydroxides, such as tetrapropylammonium hydroxide, tetrabutylammonium hydroxide, tetrapentylammonium hydroxide, tetrahexylammonium hydroxide, and benzyltrimethylammonium hydroxide, 1,5-diazabicyclo-[4.3.0]-5-nonene (DBN), 1,8-diazabicyclo[5.4.0]-7-undecene (DBU) and a derivative thereof are mentioned. However, since the hydroxide has strong basicity, it neutralizes an acid derived from the polyaniline, but it has strong nucleophilicity simultaneously so that a side reaction occurs in some cases. For example, an acid generator and the like contained in an EB resist often contains an ester bond in the structure as a linker, and the ester bond is subjected to nucleophilic attack by a hydroxide ion, and a moiety imparted with functions such as diffusion control and dissolution characteristics and the like is eliminated. Therefore, diffusion of the sulfonic acid ions which became small molecules are promoted after irradiation with the electron beam, and as a result, sensitivity fluctuation and pattern failure occur in lithography. On the other hand, although 1,5-diazabicyclo[4.3.0]-5-nonene (DBN) and 1,8-diazabicyclo[5.4.0]-7-undecene (DBU) are strong bases, they have weak nucleophilicity so that it can be considered that nucleophilic attack to the ester bond hardly occurs, but they are small molecules and when the conductive composition is formed as a film on the EB resist, diffusion thereof from the interface to the resist layer occurs and the acid generated from the acid generator after electron beam writing is quenched, and as a result, there is a problem that sensitivity fluctuation and pattern failure occur in lithography.

CITATION LIST

Patent Literature

Patent Document 1: JP 2902727 B
Patent Document 2: U.S. Pat. No. 5,370,825 B2
Patent Document 3: JP 2014-009342 A
Patent Document 4: JP 3631910 B
Patent Document 5: JP 2017-39927 A
Patent Document 6: JP 2020-147630 A
Patent Document 7: JP 2021-21020 A

SUMMARY OF INVENTION

Technical Problem

As the polyaniline compounds shown in Patent Documents 1, 4, and 5, those in which an acidic substituent is introduced into the structure of a monomer unit of the π-conjugated conductive polymer are used, and take forms in which the acidic substituent is self-doped in the π-conjugated conductive polymer chain. However, not all the acidic substituents existing in the π-conjugated conductive polymer after polymerization are doped in the π-conjugated system, but these are present in the polymer as an acid or a salt thereof. In the state of the acid, the polyaniline is formed as an antistatic film on the electron beam resist at the time of electron beam irradiation, and the acid diffuses into the resist layer to exert adverse effects on lithography. In addition, for the purpose of controlling the diffusion of the acid, when a strong base such as a hydroxide and the like is added as a neutralizing agent, neutralization itself is difficult, and the unreacted strong base in the film permeates the resist layer to cause a side reaction with the portion which is subjected to nucleophilic attack such as an ester bond in the resist composition, and as a result, adverse effects are exerted on sensitivity and lithography. Further, the state of the salt means that, acidic groups contained in a monomer unit before polymerization are previously neutralized by a strong base such as an amine before polymerization, and the monomer is polymerized and the product is present in a state that it is not treated with a cation exchange resin and the like. At that time, a part of the sulfonic acid salt on the polymer is considered to be in the state of an acid by sulfuric acid which is a by-product of peroxodisulfate used as a polymerization reagent, and the acid derived from the polyaniline chain diffuses from the formed film even after the removal of the single molecular impurities by purification such as ultrafiltration and the like. Therefore, for using the conductive polymer as an antistatic film of an electron beam resist, diffusion of the acid generated from an acid terminal in the polyaniline has to be controlled by an additive other than the strong base.

The effect of the strong base on the resist is remarkably exhibited in a test of storage stability, which is called PCD (Post Coating Delay), in the state of an antistatic film formed on the resist without irradiating with the electron beam. That is, a strongly basic substance existing in the antistatic film gradually penetrates and diffuses into the resist film during storage in an unirradiated state, makes a nucleophilic attack to the resist polymer or the acid generator at any time to cut a linker bonding portion of the resist, and cuts off an acid terminal of an electron beam acid generator. In the electron beam writing thereafter, the reaction of the resist outside the writing region is progressing, and an acid with a small molecule is generated and reacts with a resist polymer in the state faster in a diffusion rate than that of an original acid generator and so forth, causing remarkable sensitivity change, film reduction or pattern degradation in lithography.

In general, a polyaniline complex using an unsubstituted aniline as a raw material shows high conductivity, but has low hydrophilicity and poor dispersibility in $H_2O$, so that film-formability on a substrate is extremely bad. On the contrary, in the composition described in Patent Document 2, in a complex containing a polyaniline-based conductive polymer which is to be a base polymer and a polyacid, by introducing various kinds of substituents into the aniline skeleton, dispersibility of the polyaniline complex in $H_2O$ and film-formability on a substrate are improved, and in the above-described uses of the lithography antistatic film by the electron beam, quick response is shown in the peeling and washing process by $H_2O$. However, introducing a substituent(s) other than a hydrogen atom into the aniline skeleton makes it difficult to impart high conductivity. That is, it is difficult to improve resistance reduction as a physical index showing an antistatic property, and in the above-described future writing process expected to strongly generate a charged state of the resist layer, it is not possible to respond to sufficient divergence of the charged electric charge.

In the π-conjugated conductive polymer, as a material which is used for the antistatic film use in a writing process of the electron beam lithography, there is a polythiophene-based conductive polymer besides the above-described polyaniline-based conductive polymer. The polythiophene-based conductive polymer generally shows higher conductivity than that of the polyaniline-based conductive polymer, but affinity thereof to $H_2O$ is low as compared with that of the polyaniline-based conductive polymer, and even in the $H_2O$ dispersed material, once a film is formed, peeling thereof is difficult in a peeling and washing process by $H_2O$, or even if the film is peeled, it flows in a solid state such as a flake state and the like without being completely dissolved or dispersed again in $H_2O$, so that there is a possibility of causing serious pattern defects on lithography.

Patent Document 3 discloses an antistatic film use technology for an electron beam lithography of a polythiophene-based conductive polymer, and shows an antistatic film function and good peelability to $H_2O$ of a complex of the polythiophene-based conductive polymer and a polyanion by the effect of adding a gemini type surfactant and the like. In addition, the composition described in Patent Document 3 uses a complex containing a polythiophene-based conductive polymer and a polyacid as a base polymer, so that there is a possibility that the acid derived from the polyacid exerts an effect on the resist film, similarly to the complex containing a polyaniline-based conductive polymer and a polyacid described in Patent Document 2, but by using a neutralizing agent such as an amine and the like to alleviate the acidity, the above-described effect on lithography is minimized as much as possible. However, as a result of adding a gemini type surfactant to provide functions of good coatability and peelability, and adding amines to alleviate the acidity, a side reaction by the amine on the resist film is generated to exert an effect on lithography, and in addition, the surface resistance (Ω/□) of the film to be an index of the antistatic property shows a large value which cannot generate sufficient antistatic property, and as a conclusion, a low resistivity inherently possessed by the polythiophene-based conductive polymer does not show as a function. Therefore, in the future, in the writing process which is required to have high antistatic property, there is a concern that it cannot correspond to sufficient divergence of charges.

From the above-described matter, it has been required to develop an antistatic film for an electron beam resist writing, which has good filterability and good film-formability of a flat film on an electron beam resist, shows excellent antistatic property in an electron beam writing process due to the property of low resistance, and, without using neutralization by strong bases which exerts bad effects on lithography in order to minimize the effect of an acid diffused from the film, controls a diffusion rate of the acid by salt change of the acid by adding a salt of a carboxylic acid as an additive, and further has good peelability by $H_2O$ or an alkaline developer after writing.

The present invention has been accomplished in view of the above-described circumstances, and an object thereof is to provide a conductive polymer composition which has good filterability and film-formability of a flat film on an electron beam resist and can be suitably used for an antistatic film for electron beam resist writing, showing excellent antistatic property in the electron beam writing process owing to the property of low volume resistivity (Ω·cm), reducing an effect on lithography by minimizing an effect of an acid diffused from the film, and further having excellent peelability by $H_2O$ or an alkaline developer after writing.

Solution to Problem

To achieve the object, the present invention provides a conductive polymer composition comprising:

(A) a polyaniline-based conductive polymer having at least one kind of a repeating unit represented by the following general formula (1); and (B) a polymer containing at least one kind of an addition salt structure represented by the following general formula (2), (1)

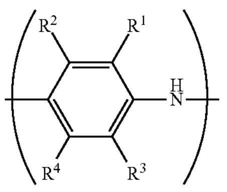

wherein $R^1$ to $R^4$ each independently represent a hydrogen atom, an acidic group, a hydroxy group, an alkoxy group, a carboxy group, a nitro group, a halogen atom, a linear or branched alkyl group having 1 to 24 carbon atoms, a linear, branched or cyclic hydrocarbon group having 1 to 24 carbon atoms containing a hetero atom, or a linear, branched or cyclic hydrocarbon group having 1 to 24 carbon atoms partially substituted with a halogen atom, (2)

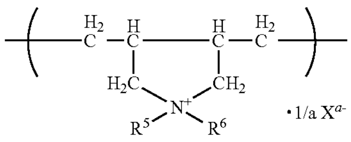

wherein $R^5$ and $R^6$ each independently represent a hydrogen atom, a linear, branched or cyclic alkyl group having 1 to 10 carbon atoms, or a linear, branched or cyclic hydrocarbon group having 1 to 24 carbon atoms containing a hetero atom, $X^{a-}$ represents an anion, and "a" represents a valence.

Such a conductive polymer composition can be suitably applied to an antistatic film that exhibits high-efficiency charge dissipation in a charged state during electron beam resist writing. Thus, positional accuracy of electron beam writing can be improved. Moreover, the inventive conductive polymer composition can be used suitably particularly in lithography using an electron beam or the like, and therefore, it is possible to obtain a resist pattern having high sensitivity, high resolution, and good pattern profile.

Furthermore, the acidic group in the general formula (1) is preferably a sulfo group.

When the repeating unit represented by the general formula (1) contains an acidic group, and the acidic group is a sulfo group, a polyaniline main chain can be efficiently doped and high conductivity can be exhibited. Thus, using such a component (A), the advantageous effects of the present invention can be achieved more sufficiently.

The anion represented by $X^{a-}$ is preferably a carboxylic acid ion in the structure represented by the general formula (2).

When the inventive composition contains, in the component (B), a carboxylic acid ion as the anion represented by $X^{a-}$ in the structure represented by the general formula (2), it is possible to alleviate the acidity of the polyaniline-based conductive polymer (A) having at least one kind of the repeating unit represented by the general formula (1), and diffusion of acid to adjoining layers can be controlled.

The component (B) is preferably contained in an amount of 1 part by mass to 200 parts by mass based on 100 parts by mass of the component (A).

When the contained amount of the component (B) is as described, acid diffusion from the conductive film formed with the conductive polymer composition to a touching adjacent layer can be further reduced.

Furthermore, the conductive polymer composition preferably further comprises (C) a nonionic surfactant.

When such a composition is employed, wettability of the conductive polymer composition to the body to be processed such as a substrate, etc., can be improved.

Furthermore, the component (C) is preferably contained in an amount of 0.1 parts by mass to 10 parts by mass based on 100 parts by mass of the component (A).

When the contained amount is as described, wettability to the surface of the body to be processed is better, and conductivity of the conductive film is also sufficient.

In addition, the conductive polymer composition preferably further comprises (D) a water-soluble polymer.

When such a composition is employed, it is possible to improve the uniformity of the film at the time of forming a film of the conductive polymer composition on the body to be processed such as a substrate.

Furthermore, the component (D) is preferably contained in an amount of 30 parts by mass to 150 parts by mass based on 100 parts by mass of the component (A).

When the component (D) is contained in such an amount, sufficient antistatic function can be achieved certainly while improving the uniformity of the film.

In addition, the present invention provides a coated product comprising a film of the above-described conductive polymer composition formed on a body to be processed.

The conductive film formed using the inventive conductive polymer composition is excellent in antistatic property, so that by covering various bodies to be processed with such an antistatic film, high-quality coated products can be obtained.

Furthermore, the body to be processed is preferably a substrate comprising a chemically-amplified resist film.

Furthermore, the body to be processed is preferably a substrate for obtaining a resist pattern by pattern irradiation using an electron beam.

Moreover, the body to be processed is preferably a substrate comprising a chemically-amplified electron beam resist film having a sensitivity of 20 $\mu C/cm^2$ or more.

Such a body to be processed can be used favorably in the present invention.

In addition, the present invention provides a patterning process comprising the steps of:

(1) forming an antistatic film on a resist film of a substrate provided with a chemically-amplified resist film by using the above-described conductive polymer composition;

(2) performing pattern irradiation by using an electron beam; and (3) developing the substrate by using $H_2O$ or an alkaline developer to obtain a resist pattern.

According to such a patterning process, it is possible to prevent an electron beam distortion phenomenon derived from charging of a resist surface at the time of electron beam writing, and it is possible to obtain a resist pattern having high sensitivity and high resolution and excellent pattern profile.

Advantageous Effects of Invention

Such a conductive polymer composition can be suitably applied to an antistatic film showing charge dissipation with high efficiency in a charged state at the time of electron beam resist writing, and positional precision of the electron beam writing can be improved.

In addition, the composition containing component (A), which contains a repeating unit represented by the general formula (1), and component (B) represented by the general formula (2) shows high conductivity after forming a film onto the substrate and simultaneously, has high affinity to $H_2O$ and good filterability, and also good film-formability of a flat film on the electron beam resist. In addition, in the peeling process after film formation, peeling by $H_2O$ or an aqueous alkaline solution is facilitated. A composition containing such a component (A) and component (B) can form a conductive film having good film-formability and peelability by $H_2O$ or an aqueous alkaline solution and showing high conductivity, i.e., low surface resistant property (Ω/□) to give high positional accuracy in the electron beam writing to the resist, good resist pattern profile, and an antistatic film without peeling fragments or insoluble residual film on the resist pattern after resist development, and the composition can be used suitably for electron beam lithography.

In addition, owing to the component (B), it is possible to control the effect of acid diffusion from the film formed from the composition to the adjacent layer, high conductivity and antistatic property with a high charge dissipation ability are exhibited, and additionally, excellent resist lithography can be provided after peeling.

The composition containing component (A) and component (B) of the present invention shows good peelability by $H_2O$ or an aqueous alkaline solution after formation of the film. In the electron beam writing to the electron beam resist and the patterning process, the formed film containing the composition can be peeled using $H_2O$ before heat treatment after writing, and it is possible to peel off the formed film by an aqueous alkaline solution (an alkaline developer) similarly at the elution portion of the resist pattern in the resist pattern development process after heat treatment after writing. Thus, peeling of the film by $H_2O$ or an aqueous alkaline solution is easy, so that the composition shows an effect of reducing fine defects derived from a film formation material residue in the peeling process after electron beam writing.

In addition, the nonionic surfactant (C) and the water-soluble polymer (D) do not inhibit peelability by $H_2O$ or an aqueous alkaline solution after film formation in the inventive composition containing the component (A) and the component (B). The formed film using the composition containing the nonionic surfactant (C) and the water-soluble polymer (D) can be easily peeled with $H_2O$ or an aqueous alkaline solution, and can be peeled with $H_2O$ before a heat treatment after electron beam writing. In addition, the film can also be peeled with an aqueous alkaline solution (alkaline developer) in the resist pattern development process in lithography after the heat treatment after the electron beam writing in the same manner as the elution portion of the resist pattern. Since the film can be peeled off easily with $H_2O$ or an aqueous alkaline solution as described, the inventive composition also exhibits an effect of reducing ultrafine defects originating from a film formation residue in the peeling process after the electron beam writing.

In addition, by covering various bodies to be processed with an antistatic film formed by using the inventive conductive polymer composition, a coated product having high quality can be obtained.

DESCRIPTION OF EMBODIMENTS

As described above, there has been requirement for a conductive polymer composition which has good coatability and film-formability to a substrate and can form a conductive film with good film quality, is excellent in peelability by $H_2O$ or an aqueous alkaline solution, exhibits antistatic property with high charge dissipation ability, does not use a strong base for controlling diffusion of the acid generated from the film to the adjacent layer, and is suitably used for a high conductivity antistatic film in resist lithography using an electron beam and the like.

In a polyaniline compound showing high conductivity which uses component (A) alone as a raw material, a sulfo group which is not consumed in doping is present so that a solution or a dispersion thereof shows acidity. When a liquid material using component (A) alone as a raw material is formed as an antistatic film on an electron beam resist at the time of electron beam irradiation, an acid diffuses into the resist layer which exerts an adverse effect on the lithography. In addition, when a strong base such as a hydroxide, etc., is added as a neutralizing agent for the purpose of controlling diffusion of the acid, precise neutralization itself is difficult, and moreover, when the composition is formed as an antistatic film on the electron beam resist at the time of electron beam irradiation, if an excessive strong base is present in the film, the strong base penetrates into the resist layer and causes side reaction with a portion to be nucleophilically attacked such as an ester bond in a resist base polymer or an acid generator, or reacts with an acid generated from an acid generator in the resist after writing, whereby the strong base exerts bad effects on writing sensitivity and lithography after development.

In Patent Document 6, rather than the strong base, salts of various carboxylic acids are added to allow ion exchange between the salt and the sulfo group that is not consumed in doping of the polyaniline compound in the composition, and the carboxylic acid, which is a weak acid, is released. Thus, the acidity of the composition is alleviated. However, although the carboxylic acid itself released after the ion exchange does not undergo a side reaction with the base polymer of the electron beam resist or cause function impediment since carboxylic acid is a weak acid, the original carboxylate is a monomer, so that a salt that has not undergone ion exchange is transferred and diffused into the resist layer, etc. during thermal film formation using a conductive composition or resist PEB, and furthermore, when a substrate having a film formed on a resist upper layer is stored over a long period. This causes a decrease in the proportion of existing carboxylate that actually functions in the film of the conductive composition. Thus, the diffusion of the acid component derived from sulfo groups in the polyaniline compound to the resist cannot be sufficiently controlled. This may not have much effect in some cases depending on the resist pattern, but in lithography where isolated resist patterns are left in a large writing area of an isolated pattern of a positive resist, etc., or when a substrate having a film of a conductive composition formed on a resist upper layer is stored for a long time, the developed resist pattern is degraded or limiting resolution is significantly lowered.

The present inventors have earnestly studied the problems, and found out that by coating a resist with a composition containing a component (A) polyaniline-based conductive polymer which contains a repeating unit represented by the general formula (1) and a component (B) polymer which contains at least one kind of an addition salt structure represented by the general formula (2) at the time of electron beam irradiation to an electron beam resist, it is possible to form an antistatic film having good film-formability, film quality, and film flatness, showing low surface resistance (Ω/□), i.e., high conductivity, having good peelability by $H_2O$ or an aqueous alkaline solution, and diffusion of an acid generated from component (A) into the resist being controlled.

In addition, the following was found. By adding a nonionic surfactant (C) and a water-soluble polymer (D) or either one of these to the above-described conductive polymer dispersion, wettability of the composition containing a polyaniline-based conductive polymer of component (A) which contains a repeating unit represented by the general formula (1) and a polymer of component (B) represented by the general formula (2) to a surface of a body to be processed is further improved so that film-formability is improved and film uniformity is also improved.

In addition, the conductive polymer composition to be suitably used for the above-described uses of the present invention can be obtained by, for example, mixing a polyaniline-based polymer of component (A), a polymer of component (B) and a solvent, and if necessary, a nonionic surfactant of component (C), and a water-soluble polymer of component (D), and filtering with a filter, etc. Furthermore, a coated product and a substrate provided with a thin film formed by using the inventive conductive polymer composition can be obtained by, for example, applying the inventive conductive polymer composition on a substrate and subjecting to heat treatment, IR or UV irradiation, etc.

That is, the present invention is a conductive polymer composition comprising:

(A) a polyaniline-based conductive polymer having at least one kind of a repeating unit represented by the following general formula (1); and (B) a polymer containing at least one kind of an addition salt structure represented by the following general formula (2),

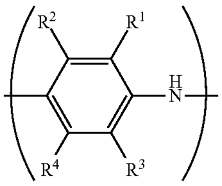

(1)

wherein $R^1$ to $R^4$ each independently represent a hydrogen atom, an acidic group, a hydroxy group, an alkoxy group, a carboxy group, a nitro group, a halogen atom, a linear or branched alkyl group having 1 to 24 carbon atoms, a linear, branched or cyclic hydrocarbon group having 1 to 24 carbon atoms containing a hetero atom, or a linear, branched or cyclic hydrocarbon group having 1 to 24 carbon atoms partially substituted with a halogen atom,

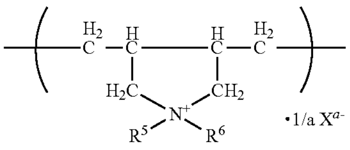

(2)

wherein $R^5$ and $R^6$ each independently represent a hydrogen atom, a linear, branched or cyclic alkyl group having 1 to 10 carbon atoms, or a linear, branched or cyclic hydrocarbon group having 1 to 24 carbon atoms containing a hetero atom, $X^{a-}$ represents an anion, and "a" represents a valence.

Hereinafter, the present invention will be described in further detail, but the present invention is not limited thereto.

<Conductive Polymer Composition>

The present invention is a conductive polymer composition containing: (A) a polyaniline-based conductive polymer having at least one kind of a repeating unit represented by the general formula (1); and (B) a polymer containing at least one kind of an addition salt structure represented by the general formula (2).

[Component (A)]

The polyaniline-based conductive polymer of component (A) contained in the inventive conductive polymer composition is a polyaniline-based conductive polymer having at least one kind of a repeating unit represented by the following general formula (1).

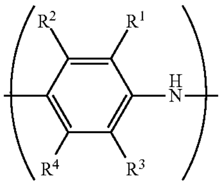

(1)

In the formula, $R^1$ to $R^4$ each independently represent a hydrogen atom, an acidic group, a hydroxy group, an alkoxy group, a carboxy group, a nitro group, a halogen atom, a linear or branched alkyl group having 1 to 24 carbon atoms, a linear, branched or cyclic hydrocarbon group having 1 to 24 carbon atoms containing a hetero atom, or a linear, branched or cyclic hydrocarbon group having 1 to 24 carbon atoms partially substituted with a halogen atom.

The polyaniline-based conductive polymer is a n-conjugated system polymer, and is an organic polymer in which the main chain is constituted by aniline or a derivative other than a para-substituted material of aniline. In the present invention, the component (A) is preferably a polymer containing the repeating unit represented by the general formula (1) (aniline monomer), at least one of $R^1$ to $R^4$ being an acidic group. Incidentally, a sulfo group is more preferable among acidic groups. In addition, from the viewpoints of high affinity to $H_2O$, high-efficiency filterability, peelability to $H_2O$ or an alkali developer after film formation, low-defect property in lithography, easiness in polymerization, low reaggregation during storage, and stability in the air, it is desirable to introduce a hydrophilic substituent other than a sulfo group into $R^1$ to $R^4$ in the repeating unit represented by the general formula (1) of the component (A). Examples of the hydrophilic substituent include an alkoxy group, a carboxy group, and a hydroxy group. Such a self-doping type, i.e., intramolecular-doping type polyaniline-based conductive polymer having at least one kind of repeating unit having a sulfo group and a hydrophilic substituent is particularly effective.

Alternatively, the component (A) may be a polymer that exhibits a conductive function by supplementary doping with a dopant such as an acid or a halogen ion outside the molecule besides the doping with an acid substituent within the molecule.

Specific examples of sulfonic acid-substituted aniline include o- and m-aminobenzenesulfonic acid, alkyl group-substituted aminobenzenesulfonic acids, such as methylaminobenzenesulfonic acid, ethylaminobenzene-sulfonic acid, n-propylaminobenzenesulfonic acid, iso-propylaminobenzenesulfonic acid, n-butylaminobenzene-sulfonic acid, sec-butylaminobenzenesulfonic acid, t-butylaminobenzene-sulfonic acid, etc., alkoxyamino-benzenesulfonic acids, such as methoxyaminobenzene-sulfonic acid, ethoxyaminobenzenesulfonic acid, propoxyaminobenzenesulfonic acid, etc., hydroxy-substituted aminobenzenesulfonic acids, nitro group-substituted aminobenzenesulfonic acids, halogen group-substituted aminobenzenesulfonic acids, such as fluoro-aminobenzenesulfonic acid, chloroaminobenzene-sulfonic acid, bromoaminobenzenesulfonic acid, etc., and sulfonic acid-disubstituted anilines, such as aniline 2-6-disulfonic acid, aniline 3-5-disulfonic acid, etc.

One kind of the sulfonic acid-substituted aniline may be used, or two or more kinds thereof may be used in mixture at any proportion. Furthermore, in view of $H_2O$ affinity, conductivity, and product stability of the polyaniline formed from these sulfonic acid-substituted anilines, alkoxyamino-benzenesulfonic acids and hydroxy-substituted aminobenzenesulfonic acids are suitably used.

In addition, the component (A) polyaniline-based conductive polymer can also be formed by copolymerizing an aniline in which at least one of $R^1$ to $R^4$ of the repeating unit represented by the general formula (1) is substituted by a sulfo group and an aniline having no sulfo groups.

Specific examples of anilines having no sulfo groups include aniline, 2-methoxyaniline, 2-isopropoxyaniline, 3-methoxyaniline, 2-ethoxyaniline, 3-ethoxyaniline, 3-isopropoxyaniline, 3-hydroxyaniline, 2,5-dimethoxyaniline, 2,6-dimethoxyaniline, 3,5-dimethoxyaniline, 2,5-diethoxyaniline, 2-methoxy-5-methylaniline, 5-tertbutyl-2-methoxyaniline, 2-hydroxy-aniline, 3-hydroxyaniline, etc.

In particular, aniline, 2-methoxyaniline, 3-methoxyaniline, 2-ethoxyaniline, 3-ethoxyaniline, 2-isopropoxyaniline, 3-isopropoxyaniline and 3-hydroxyaniline are suitably used since affinity to $H_2O$ is not degraded even when the anilines are copolymerized with an aniline monomer in which at least one of $R^1$ to $R^4$ in the general formula (1) is a sulfo group, and from the viewpoints of conductivity, reactivity, and product stability.

In the component (A) polyaniline-based conductive polymer to be used in the present invention, methoxyaminobenzenesulfonic acids are preferable among the above-described repeating units from the viewpoints of solubility, conductivity, and the cost of raw materials. Among these, 3-amino 4-methoxybenzene-sulfonic acid is further preferable, and a copolymer of two repeating units 3-amino 4-methoxybenzenesulfonic acid and unsubstituted aniline is further preferable. Furthermore, the coexisting base at the time of polymerization is preferably pyridine from the viewpoints of handling, cost, basicity and harmlessness to the constitutional elements of the resist. Even after polymerization and formation, pyridine is contained in the polymer as residual ions, and when the composition is applied onto an electron beam resist, the effect on lithography can be minimized.

[Component (B)]

The component (B) contained in the inventive conductive polymer composition is a polymer containing one or more kinds of an addition salt structure represented by the following general formula (2).

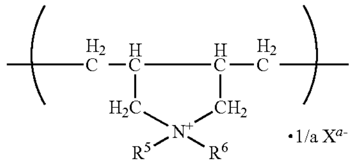

(2)

In the formula, $R^5$ and $R^6$ each independently represent a hydrogen atom, a linear, branched or cyclic alkyl group having 1 to 10 carbon atoms, or a linear, branched or cyclic hydrocarbon group having 1 to 24 carbon atoms containing a hetero atom, $X^{a-}$ represents an anion, and "a" represents a valence.

In the structure represented by the general formula (2), specific examples of preferable $R^5$ and $R^6$ include a hydrogen atom, a methyl group, an ethyl group, an n-propyl group, an isopropyl group, various kinds of butyl groups, a 2-hydroxyethyl group, a 2-hydroxypropyl group, a 3-hydroxypropyl group, a cyclohexyl group, a benzyl group, a phenethyl group, etc.

In the structure represented by the general formula (2), $X^{a-}$ represents an anion and "a" represents a valence. That is, "1/a $X^{a-}$" in the general formula (2) indicates that there are "a" cations $N^+$ per anion $X^{a-}$. Furthermore, the anion represented by $X^{a-}$ is not particularly limited, but is preferably a halogen ion, a methylsulfate ion, an ethylsulfate ion, or a carboxylic acid ion, such as an acetate ion, and a carboxylic acid ion is more preferable.

Details of the component (B) contained in the inventive conductive polymer composition are given in Patent Document 7 as a constitutional unit (I), and can be purchased from NITTOBO MEDICAL CO., LTD. as Polyamine series (PAS) or Poly-allylamine (PAA (registered trademark)) series.

As specific examples of the structure of the general formula (2), the following addition salt structures are preferable.

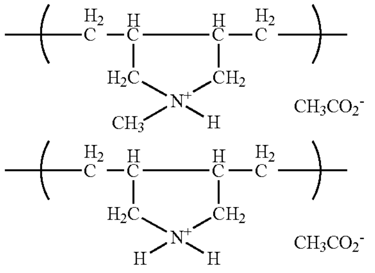

As the component (B), a polymer having high solubility in water is preferable in view of handling. In addition, the component (B) preferably has high solubility in water and has a molecular weight Mw of 40000 or less, further preferably, a molecular weight Mw of 20000 or less so as to prevent degradation in the dispersibility of particles and agglomeration or precipitation of particles caused by ion exchange occurring between the component (A) and the component (B) to form an association and the molecular weight increasing when a composition is formed using the component (A) polyaniline-based conductive polymer and the component (B). Note that the molecular weight can be measured as a weight-average molecular weight (Mw) by gel permeation chromatography (GPC) in terms of polystyrene.

[Other Components]

(Surfactant)

In the present invention, in order to increase wettability to the body to be processed such as a substrate, a surfactant may be added. Examples of such surfactants include various kinds of surfactants such as nonionic, cationic, and anionic, and from stability of the conductive polymer, a nonionic surfactant (C) is particularly preferable. Specifically, for example, nonionic surfactants such as a polyoxyethylene alkyl ether, a polyoxyethylene alkylphenyl ether, a polyoxyethylene carboxylic acid ester, a sorbitan ester, a polyoxyethylene sorbitan ester, acetylene glycol, etc., are suitable, and there may be mentioned cationic surfactants, such as an alkyltrimethylammonium chloride, an alkylbenzylammonium chloride, etc., anionic surfactants, such as an alkyl or alkylallyl sulfate, an alkyl or alkylallyl sulfonate, a dialkyl sulfosuccinate, etc., and amphoteric surfactants such as amino acid type, a betaine type, etc.

When such a material is employed, wettability of the conductive polymer composition to the body to be processed such as a substrate can be increased.

(Water-Soluble Polymer)

In addition, in the present invention, in order to improve uniformity of the film when the film is formed onto the body to be processed such as a substrate, a water-soluble polymer (D) may be further added. Such a water-soluble polymer is preferably a homopolymer or a copolymer having hydrophilic repeating units. In addition, such a hydrophilic repeating unit preferably has a vinyl group as a polymerizable functional group, and furthermore, in view of controlling diffusion of an acid generated from the component (A), a compound containing a nitrogen atom in the molecule is preferable. Specifically, polyvinyl pyrrolidone or the like is preferable.

At this time, if the nitrogen atom in the molecule does not have nucleophilicity, it is more preferable since there is no risk of causing a side reaction to a functional group to be nucleophilically attacked such as an ester group contained in the resist polymer or the acid generator in the resist composition as described above. Therefore, as the above-described repeating unit, a nitrogen-containing heterocyclic compound is more desirable than material having a nitrogen atom at the terminal like acrylamides. In addition, at that time, a material in which the nitrogen atom forms the main chain of the cyclic structure and is bonded to the vinyl group is more preferable. Examples of such a repeating unit include N-vinyl-2-pyrrolidone, N-vinylcaprolactam, etc.

When such a material is employed, it is possible to improve uniformity of the film when the conductive polymer composition is applied onto a body to be processed such as a substrate to form a film.

<Method for Manufacturing Polyaniline-Based Conductive Polymer>

Patent Document 4 (JP 3631910 B) proposes a self-doping type sulfonated polyaniline which exhibits conductivity without forming a complex with a doping agent or a polymer dopant and a method for synthesizing the polyaniline. Many of the polyaniline materials before these are materials to which a dopant is added, but are insoluble in almost all the organic solvents, and the purified polymer has basically low solubility even when the solvent is $H_2O$, and even if it is possible to disperse the polyaniline in $H_2O$ using a polymer dopant, the polyaniline has particle property so that it is difficult to remove aggregates of particles which can be a cause of defects in uses such as mounting as a light-transmission film for electronic devices and thin film formation in relation with semiconductors and the like, and in addition, in filtration purification to be usually used for purification of a polymer, there has been a problem in stable production that aggregates are filtered out and such like by a filtration filter to cause fluctuation of the solid content and there has been a limit to reduce the pore size of the filtration filter and the like.

When the component (A) handled in the present invention is a self-doping type polyaniline, for example, the above-described repeating unit represented by the general formula (1) (that is, component (A)) can be obtained by performing oxidation polymerization by adding an oxidizing agent into an aqueous solution or a mixed solution of water and an organic solvent. As the polymerization recipe of component (A), a well-known method can be applied and is not particularly limited. Specifically, a monomer for obtaining a repeating unit represented by the general formula (1) can be polymerized by various kinds of synthesis methods such as a chemical oxidation method, an electrolytic oxidation method, etc. As such a method, for example, the prescriptions described in JP 3154460 B and JP 2959968 B can be applied.

As described above, the component (A) polyaniline-based conductive polymer formed by the above-described polymerization method is soluble in both of $H_2O$ and an organic solvent because of its molecular properties, so that filtration and purification are facilitated, and generation of aggregates which become a factor of defects is reduced and efficiency of removal by filtration is also improved.

As the polymerization initiator to be used for polymerization of component (A), it is possible to use peroxodisulfate salts (persulfate salt), such as ammonium peroxodisulfate (ammonium persulfate), sodium peroxodisulfate (sodium persulfate), potassium peroxodisulfate (potassium persulfate), etc., peroxides, such as hydrogen peroxide, ozone, etc., organic peroxides, such as benzoyl peroxide, etc., and oxygen, etc.

As the reaction solvent to be used for carrying out oxidation polymerization, water or a mixed solvent of water and a solvent can be used. The solvent herein used is preferably a solvent which is miscible with water, and capable of dissolving or dispersing component (A) and component (B). Examples include alcohols, such as methanol, ethanol, propanol, butanol, etc., polyvalent aliphatic alcohols, such as ethylene glycol, propylene glycol, 1,3-propanediol, dipropylene glycol, 1,3-butylene glycol, 1,4-butylene glycol, D-glucose, D-glucitol, isoprene glycol, 1,2-butanediol, 1,3-butanediol, 1,4-butanediol, 2,3-butanediol, 1,2-pentanediol, 1,5-pentanediol, 1,2-hexanediol, 1,6-hexanediol, 1,9-nonanediol, neopentyl glycol, etc., linear ethers, such as dialkyl ether, ethylene glycol monoalkyl ether, ethylene glycol dialkyl ether, propylene glycol monoalkyl ether, propylene glycol dialkyl ether, polyethylene glycol dialkyl ether, polypropylene glycol dialkyl ether, etc., cyclic ether compounds, such as dioxane, tetrahydrofuran, etc., polar solvents, such as cyclohexanone, methyl amyl ketone, ethyl acetate, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, N-methyl-2-pyrrolidone, N,N'-dimethylformamide, N,N'-dimethylacetamide, dimethyl-sulfoxide, hexamethylene phosphoric triamide, etc., carbonate compounds, such as ethylene carbonate, propylene carbonate, etc., heterocyclic compounds, such as 3-methyl-2-oxazolidinone, etc., and nitrile compounds such as acetonitrile, glutaronitrile, methoxyacetonitrile, propionitrile, benzonitrile, etc. One of these solvents may be used, or a mixture of two or more kinds thereof may be used. A contained amount of these solvents miscible with water is preferably 50 mass % or less based on the whole reaction solvent.

Polymerization of component (A) polyaniline-based conductive polymer can be carried out by dissolving the monomer(s) for obtaining the repeating unit represented by the general formula (1) in a solvent, and dropping a polymerization initiator thereto, and when solubility of the monomer is low, an initial concentration may be low in some cases in order to form a uniform reaction system. The lowering in the initial concentration causes lowering in polymerization reaction, and the polymer to be formed cannot have a molecular weight for possessing sufficient conductivity or film-formability in some cases. Therefore, in order to sufficiently increase the initial concentration of the monomer at the time of polymerization, it is desirable to add a base to the monomer to form a salt with a sulfo group in the monomer to increase solubility thereof and to perform polymerization.

The initial concentration of the monomer for obtaining the repeating unit of the general formula (1) in the polymerization is preferably 1.0 to 2.0 mol/L, and furthermore, 1.5 to 1.8 mol/L is more preferable.

The repeating unit represented by the general formula (1) is more preferably subjected to oxidation polymerization by an oxidizing agent in the presence of a base. The sulfo group in the monomer for obtaining a repeating unit of the general formula (1) in the polymerization forms a salt with the base. An acidity of the solution at this time is preferably pH<7.0.

In addition, when the above-described polymerization is carried out, in an aqueous solution or a mixed solution of water and an organic solvent, an organic cation represented by the following general formula (4) or an ion of an alkali metal or an alkaline earth metal co-presented as a base forms a salt with an acidic group in the repeating unit of the general formula (1).

The organic cation represented by the following general formula (4) is preferably those formed from ammonia, aliphatic amines, cyclic saturated amines, and cyclic unsaturated amines in contact with an acid.

(4)

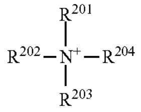

In the formula, $R^{201}$, $R^{202}$, $R^{203}$ and $R^{204}$ each independently represents a hydrogen atom, a linear, branched or cyclic alkyl group, alkenyl group, oxoalkyl group or oxoalkenyl group each having 1 to 12 carbon atoms, an aryl group having 6 to 20 carbon atoms, or an aralkyl group or an aryloxoalkyl group each having 7 to 12 carbon atoms, and a part or whole of the hydrogen atoms of these groups may be substituted by an alkoxy group. $R^{201}$ and $R^{202}$, or $R^{201}$, $R^{202}$ and $R^{204}$ may form a ring, and when a ring is formed, $R^{201}$ and $R^{202}$, and $R^{201}$, $R^{202}$ and $R^{204}$ each represent an alkylene group having 3 to 10 carbon atoms or a heteroaromatic ring having the nitrogen atom in the formula in the ring.

The component (A) polyaniline-based conductive polymer thus polymerized is filtered and isolated as precipitated material in the reaction mixture. As the filtration method, reduced pressure filtration, pressure filtration, centrifugation, centrifugal filtration and the like are used, and from easiness in the method and adaptability to large-scale synthesis, filtration under reduced pressure is suitable and the filtrated precipitates can be washed with a poor solvent on a funnel.

In addition, the component (A) polyaniline-based conductive polymer thus obtained is dissolved again in $H_2O$ after drying, and impurities can be removed by the method of ultrafiltration and the like.

Examples of the system of the ultrafiltration include a pressurization system, a cross-flow system, and the like, and from the viewpoints of productivity and a scale of the purified material, it is preferable to use a cross-flow system. In addition, even in the cross-flow system, depending on a prescription, there are a continuous circulation system (purification is controlled by time, and in a purification process, a stock solution is diluted by adding a solvent as needed to cope with a high viscosity by concentration) and a sequential processing system (for purifying a stock solution, a process in which at the time of concentrating to a concentration of 2-fold, the stock solution is diluted to the original concentration is regarded as one process, and the process is repeated until the desired degree of purification is achieved), and the component (A) can be processed by either of the prescriptions.

In addition, examples of the structure of the membrane to be used for ultrafiltration include a flat membrane type, a hollow fiber membrane type, a tubular membrane type, a spiral membrane type, and the like, and examples of a material of the separating membrane include cellulose, cellulose acetate, polysulfone, polypropylene, polyester, polyethersulfone, polyvinylidene fluoride and the like, and in the present process, there is no limitation in any of the combinations, and in the case that the solvent of the purified material is $H_2O$ or an acidic solution, a separation membrane made of polyethersulfone is desirable, and as the structure of the membrane, it is preferable to use a hollow fiber membrane type in view of a scale of the treating liquid and treatment efficiency.

Considering that the substances to be removed in the ultrafiltration process are a small molecule of an unreacted substance and a polymerization by-product, a fractionation molecular weight of the membrane is preferably in the range of 1,000 to 150,000, and further preferably in the range of 5,000 to 30,000.

In addition, at this time, considering concentration of the purified stock solution to a 2-fold concentration and efficiency of dialysis by a filtration membrane, a concentration of the stock solution is preferably 0.5 to 1.5% by weight.

In the system of the ultrafiltration, when purification is carried out by a cross-flow sequential processing system, impurity ions in the filtrate can be quantified by ion chromatography at each stage. Here, in the ions which can be quantified by analysis, there are $SO_4^{2-}$, $NH_4^+$, $Na^+$ and the like, and other ions can also be appropriately made an object to be quantified. The concentrations of $SO_4^{2-}$, $NH_4^+$ and $Na^+$ at the time of completion of ultrafiltration purification are preferably 10 ppm or less, and more preferably 1 ppm or less.

The component (A) polyaniline-based conductive polymer purified by ultrafiltration is a solution of $H_2O$ at the time of completion of the purification, and can be precipitated and purified again with a water-soluble poor solvent such as acetone and the like. The precipitated component (A) polyaniline-based conductive polymer is filtered under reduced pressure and the filter-separated precipitate can be washed again with a poor solvent.

<Method for Manufacturing Conductive Polymer Composition>

The conductive polymer composition suitably used for the above-described uses of the present invention can be obtained by, for example, mixing the polyaniline-based polymer of component (A), the polymer of component (B) and a solvent, and further, if necessary, the nonionic surfactant of component (C) and the water-soluble polymer of component (D), and filtering through a filter or the like.

In this event, it is preferable to use $H_2O$ as a main solvent since the component (A) polyaniline-based conductive polymer and the component (B) polymer in the present invention, and furthermore, in some cases, component (C) nonionic surfactant and component (D) water-soluble polymer can all be dissolved, and moreover, in order to prevent mixing with a resist layer when forming a film on an electron beam resist and to minimize adverse effects on lithography.

A solid content of the component (A) in the composition may vary depending on the charge diffusion property and film thickness required for the antistatic film of the electron beam resist, but considering peeling immediately after electron beam writing or peelability with high efficiency at development, the solid content is preferably 0.05 to 2.0 wt %, further preferably 0.1 to 1.5 wt %.

Meanwhile, in this event, component (B) is preferably contained in an amount of 1 part by mass to 200 parts by mass based on 100 parts by mass of component (A). Furthermore, component (B) is more preferably contained in an amount of 20 parts by mass to 200 parts by mass based on 100 parts by mass of component (A), further preferably 40 parts by mass to 150 parts by mass based on 100 parts by mass of component (A), and particularly preferably 60 parts by mass to 120 parts by mass.

When the contained amounts of component (A) and component (B) are as described above, acid diffusion from the conductive film formed by the conductive polymer composition to the contacting adjacent layers can be more reduced. When a body to be processed on which such a conductive film is to be formed is a substrate provided with a chemically-amplified resist film and the object thereof is to obtain an antistatic effect at the time of electron beam writing, the conductive film exhibits the antistatic effect and enhances the precision of the writing position, and the effect of acid diffusion from the conductive film to the resist is reduced so that a high-resolution resist pattern can be obtained.

In addition, when a nonionic surfactant (C) is to be added, the contained amount thereof is preferably 0.1 parts by mass to 10 parts by mass based on 100 parts by mass of the component (A), and moreover, the amount is more preferably 0.5 parts by mass to 5 parts by mass.

Furthermore, when a water-soluble polymer (D) is to be added, the contained amount thereof is preferably 30 parts by mass to 150 parts by mass based on 100 parts by mass of the component (A), and moreover, the amount is more preferably 90 parts by mass to 120 parts by mass.

When the conductive polymer composition described above is employed, the composition has good filterability and coatability, and an antistatic film suitable for electron beam lithography can be formed.

The conductive polymer composition thus obtained can form an antistatic film by applying onto an electron beam resist or a body to be processed such as a substrate by various methods. Specific examples include application with a spin coater and the like, bar coater, dipping, comma coating, spray coating, roll coating, screen printing, flexographic printing, gravure printing, inkjet printing and the like. After coating, a conductive film can be formed by performing heat treatment using a hot air circulation furnace, a hot plate, etc., IR or UV irradiation, etc.

Furthermore, the inventive conductive polymer composition can be suitably used not only for an antistatic film relating to lithography, but also as a material for forming a laminated film as a device constitutional element in an organic thin film device. Moreover, the inventive conductive polymer composition can also be suitably used as a material for forming an electrode film such as a transparent electrode use for an organic EL display, an organic EL lighting, a solar cell, and the like from excellent conductivity, film-formability, and transparency, or a material for forming a carrier transfer film similarly including a carrier injection layer or carrier transfer layer uses for an organic EL display, an organic EL lighting, a solar cell and the like from the properties exhibiting carrier transfer with high efficiency derived from a $\pi$-conjugated system network.

When component (B) is used in the inventive conductive polymer composition, even when used as a formation layer in a multilayer structure in the constitution of an organic thin film device, component (B) does not exert any adverse effects by an acid on an adjacent layer in the laminated structure, so that it is possible to avoid degeneration at the interface of the constitutional materials of the adjacent layer or side reactions and degradation by an acid after the device is constituted.

<Coated Product>

The present invention provides a coated product including the inventive conductive polymer composition being formed as a film on a body to be processed. The conductive film formed using the inventive conductive polymer composition is excellent in antistatic property, so that by covering various bodies to be processed with such an antistatic film, a coated product with high quality can be obtained.

Examples of the body to be processed include a glass substrate, a quartz substrate, a photomask blanc substrate, a resin substrate, a silicon wafer, a compound semiconductor wafer, such as a gallium arsenide wafer, indium phosphide wafer and the like, and flexible substrates such as a resin film, ultra-thin film glass, a metal foil and the like, and furthermore, the surface layer of these substrates may be coated with an organic or inorganic thin film layer for the purpose of planarization, insulation, and prevention of gas and moisture transmission.

As a coated product which is covered with the conductive film obtained by using the inventive conductive polymer composition, examples include a glass substrate, a resin film, a photoresist substrate, etc., coated with the inventive conductive polymer composition as an antistatic film.

In addition, since the inventive conductive polymer composition adapts to an independent antistatic film peeling process in the electron beam resist writing process or an antistatic film peeling process included in the development process, the inventive composition can be used suitably even when the body to be processed is a substrate provided with a chemically-amplified resist film. Furthermore, when the substrate is for obtaining a resist pattern by pattern-irradiation with an electron beam, more suitable results can be obtained. In addition, the body to be processed may be a substrate provided with a chemically-amplified electron beam resist film having a sensitivity of 20 μC/cm$^2$ or more.

<Patterning Process>

Furthermore, the present invention provides a patterning process including the steps of:

(1) forming an antistatic film on a resist film of a substrate provided with a chemically-amplified resist film by using the inventive conductive polymer composition;

(2) performing pattern irradiation by using an electron beam; and (3) developing the substrate by using $H_2O$ or an alkaline developer to obtain a resist pattern.

The patterning process can be carried out according to a conventional manner except for using the inventive conductive polymer composition, and the antistatic film formed using the conductive polymer composition may be, after electron beam writing, peeled off by $H_2O$ before a heat treatment, or may be peeled off using a developer in the resist pattern development step after a heat treatment. After development of the resist pattern, an etching process and other various kinds of processes may be of course carried out.

According to such a patterning process, charging phenomenon at the time of the exposure can be prevented, and a pattern having high sensitivity and high resolution, and also a good pattern profile can be obtained.

EXAMPLE

Hereinafter, the present invention will be described more specifically with reference to Production Examples, Examples, and Comparative Examples. However, the present invention is not limited thereto.

[Synthesis of Self-Doping Type Polyaniline-Based Conductive Polymer]

(Production Example) Synthesis of Polyaniline-Based Conductive Polymer

In 400 ml of acetonitrile/$H_2O$ mixed liquid (acetonitrile/$H_2O$=1/1) was dissolved 114.1 g of ammonium peroxodisulfate, and to the mixture in a cooled state at 0° C. was added dropwise, at a dropping rate of 1.5 ml/min, a liquid in which 96.3 g of 3-amino 4-methoxybenzenesulfonic acid and 4.66 g of aniline were completely dissolved in 300 ml of an acetonitrile/$H_2O$ mixed liquid (acetonitrile/$H_2O$=1/1) containing 2 mol/L of pyridine and cooled to 0° C. After the entire solution had been dropped, the temperature of the reaction system was raised to 25° C. and stirred for 12 hours. After stirring, the precipitated material was collected with a Buchner funnel, washed with methanol, and then dried to obtain 45 g of a powder-form conductive polymer. The conductive polymer thus obtained was dissolved again in $H_2O$ so as to achieve a concentration of 1.0 wt %, and purification was carried out by ultrafiltration (hollow fiber type, MWCO=1000) until the $NH_4^+$ and $SO_4^{2-}$ ion concentrations in the dialysate was 0.1 ppm. The ultrafiltration conditions were as follows.

Fractionation molecular weight of ultrafiltration membrane: 10 K

Cross flow system

Flow rate of supply liquid: 3,000 mL/min

Membrane partial pressure: 0.12 Pa

After concentration, the purified liquid was added dropwise to 4,000 mL of acetone to obtain a powder. This powder was again dispersed in 2,000 mL of ultrapure water, and added dropwise into 4,000 mL of acetone to recrystallize the powder. Then, the powder was dried to obtain a brown conductive polymer.

Ultrafiltration can be executed in either of the prescriptions, in a cross-flow system, of a continuous circulation system (purification is controlled by time, and in a purification process, a stock solution is diluted by adding a solvent as needed to deal with high viscosity by concentration) and a sequential processing system (for purifying a stock solution, a process in which the stock solution is diluted to the original concentration at the time of concentrating to a concentration of 2-fold is regarded as one process, and the process is repeated until the desired degree of purification is achieved), and a sequential processing system can be used to observe the transition of removal of impurity ions in the purification process. In the purification by the sequential processing system, the results of performing quantitative analysis of the concentrations of impurity ions contained in the discharged dialysate by ion chromatography are shown in Table 1.

TABLE 1

| Samples | $SO_4^{2-}$ | $Na^+$ | [ppm] $NH_4^+$ |
|---|---|---|---|
| 1$^{st}$ purification | 26 | <0.1 | 9.1 |
| 2$^{nd}$ purification | 13 | <0.1 | 5.2 |
| 3$^{rd}$ purification | 4.2 | <0.1 | 2.4 |
| 4$^{th}$ purification | 1.1 | <0.1 | 1.2 |
| 5$^{th}$ purification | 0.3 | <0.1 | 0.6 |
| 6$^{th}$ purification | 0.1 | <0.1 | 0.4 |
| 7$^{th}$ purification | 0.1 | <0.1 | 0.3 |
| 8$^{th}$ purification | 0.1 | <0.1 | 0.3 |
| 9$^{th}$ purification | 0.1 | <0.1 | 0.2 |

TABLE 1-continued

| Samples | $SO_4^{2-}$ | $Na^+$ | [ppm] $NH_4^+$ |
|---|---|---|---|
| 10th purification | 0.1 | <0.1 | 0.2 |
| 11th purification | 0.1 | <0.1 | 0.2 |
| 12th purification | 0.1 | <0.1 | 0.1 |
| 13th purification | 0.1 | <0.1 | 0.1 |

[Preparation of Conductive Polymer Composition Containing Polyaniline-Based Conductive Polymer]

In preparation of the conductive polymer compositions, the following were used: PAS-M-1A (20.0 wt % aqueous solution) and PAA-D19A (20.4 wt % aqueous solution) (both available from NITTOBO MEDICAL CO., LTD.) as component (B); acetylene glycol-based surfactant SURFYNOL 465 (available from Nisshin Chemical Industry Co., Ltd.) as a nonionic surfactant; polyvinyl pyrrolidone (available from NACALAI TESQUE, INC.) as a water-soluble polymer compound; and in Comparative Examples, tetra-n-butylammonium hydroxide (10% aqueous solution available from FUJIFILM Wako Pure Chemical Corporation) and tetra-n-butylammonium acetate (available from Tokyo Chemical Industry Co., Ltd.).

The structure of PAS-M-1A is as follows.

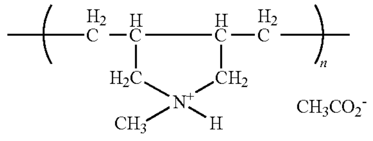

In the formula, "n" represents a positive integer.

The structure of PAA-D19A is as follows.

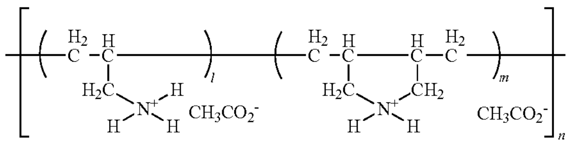

In the formula, "l", "m", and "n" represent positive integers.

Example 1

In ultrapure water in which 5.53 g of an aqueous PAS-M-1A solution had been dissolved, 3.00 g of the brown powder of the polyaniline-based conductive polymer obtained in the Production Example was dissolved, and the concentration of the solid content of the polymer was adjusted so as to be 0.15 wt %. After stirring the mixture at room temperature for 2 hours, the mixture was filtered through a polyethylene filter subjected to a hydrophilization treatment, and the resultant was obtained as Example 1.

Example 2

Except that the PAS-M-1A of Example 1 was changed to 5.57 g of PAA-D19A, preparation was carried out in the same manner as in Example 1 to obtain a conductive polymer composition.

Example 3

In ultrapure water in which 5.53 g of an aqueous PAS-M-1A solution had been dissolved, 0.045 g of acetylene glycol-based surfactant SURFYNOL 465 was dissolved as a nonionic surfactant. Furthermore, 3.00 g of the brown powder of the polyaniline-based conductive polymer obtained in the Production Example was dissolved therein, and the concentration of the solid content of the polymer was adjusted so as to be 0.15 wt %. After stirring the mixture at room temperature for 2 hours, the mixture was filtered through a polyethylene filter subjected to hydrophilization treatment, and the resultant was obtained as Example 3.

Example 4

Except that the PAS-M-1A of Example 3 was changed to 5.57 g of PAA-D19A, preparation was carried out in the same manner as in Example 3 to obtain a conductive polymer composition.

Example 5

In ultrapure water in which 5.53 g of an aqueous PAS-M-1A solution had been dissolved, 0.045 g of acetylene glycol-based surfactant SURFYNOL 465 was dissolved as a nonionic surfactant and 3.30 g of polyvinyl pyrrolidone was dissolved as a water-soluble polymer compound. Furthermore, 3.00 g of the brown powder of the polyaniline-based conductive polymer obtained in the Production Example was dissolved therein, and the concentration of the solid content of the polymer was adjusted so as to be 0.15 wt %. After stirring the mixture at room temperature for 2 hours, the mixture was filtered through a polyethylene filter subjected to hydrophilization treatment, and the resultant was obtained as Example 5.

Example 6

Except that the PAS-M-1A of Example 5 was changed to 5.57 g of PAA-D19A, preparation was carried out in the same manner as in Example 5 to obtain a conductive polymer composition.

Comparative Example 1

In ultrapure water in which 5.16 g of tetra-n-butylammonium hydroxide had been dissolved, 3.00 g of the brown powder of the polyaniline-based conductive polymer obtained in the Production Example was dissolved, and the concentration of the solid content of the polymer was adjusted so as to be 0.15 wt %. After stirring the mixture at room temperature for 2 hours, the mixture was filtered through a polyethylene filter subjected to hydrophilization treatment, and the resultant was obtained as Comparative Example 1.

Comparative Example 2

Except that the tetra-n-butylammonium hydroxide of Comparative Example 1 was changed to 0.60 g of tetra-n-butylammonium acetate, preparation was carried out in the same manner as in Comparative Example 1 to obtain a conductive polymer composition.

Comparative Example 3

In ultrapure water in which 5.16 g of tetra-n-butylammonium hydroxide had been dissolved, 0.045 g of acetylene glycol-based surfactant SURFYNOL 465 was dissolved as a nonionic surfactant. Furthermore, 3.00 g of the brown powder of the polyaniline-based conductive polymer obtained in the Production Example was dissolved therein, and the concentration of the solid content of the polymer was adjusted so as to be 0.15 wt %. After stirring the mixture at room temperature for 2 hours, the mixture was filtered through a polyethylene filter subjected to hydrophilization treatment, and the resultant was obtained as Comparative Example 3.

Comparative Example 4

Except that the tetra-n-butylammonium hydroxide of Comparative Example 3 was changed to 0.60 g of tetra-n-butylammonium acetate, preparation was carried out in the same manner as in Comparative Example 3 to obtain a conductive polymer composition.

Comparative Example 5

In ultrapure water in which 5.16 g of tetra-n-butylammonium hydroxide had been dissolved, 0.045 g of acetylene glycol-based surfactant SURFYNOL 465 was dissolved as a nonionic surfactant and 3.30 g of polyvinyl pyrrolidone was dissolved as a water-soluble polymer compound. Furthermore, 3.00 g of the brown powder of the polyaniline-based conductive polymer obtained in the Production Example was dissolved therein, and the concentration of the solid content of the polymer was adjusted so as to be 0.15 wt %. After stirring the mixture at room temperature for 2 hours, the mixture was filtered through a polyethylene filter subjected to hydrophilization treatment, and the resultant was obtained as Comparative Example 5.

Comparative Example 6

Except that the tetra-n-butylammonium hydroxide in Comparative Example 5 was changed to 0.60 g of tetra-n-butylammonium acetate, preparation was carried out in the same manner as in Comparative Example 5 to obtain a conductive polymer composition.

(Resist for Evaluation)

In the evaluation as an antistatic film for lithography (for electron beam resist) by an electron beam, a positive chemically-amplified electron beam resist (RP-1) manufactured by Shin-Etsu Chemical Co., Ltd. was used as the positive chemically-amplified resist used in combination. In addition, as a negative chemically-amplified electron beam resist, (RP-2) manufactured by Shin-Etsu Chemical Co., Ltd. was used.

[Positive Resist Composition (R-1)]

In an organic solvent were dissolved a polymer (RP-1) (100 parts by mass), an acid generator P-1 (8 parts by mass), Q-1 (4 parts by mass) as an acid diffusion controller, and a surfactant, and the obtained respective solutions were filtered through a 0.02 μm-size UPE filter to prepare a positive resist composition.

[Negative Resist Composition (R-2)]

In an organic solvent were dissolved a polymer (RP-2) (100 parts by mass), an acid generator P-1 (5 parts by mass), a fluorine-containing polymer D1 (3 parts by mass), Q-1 (7 parts by mass) as a diffusion controller, and a surfactant, and the obtained respective solutions were filtered through a 0.02 μm-size UPE filter to prepare a negative resist composition.

In addition, PF-636 (available from OMNOVA SOLUTIONS Inc.) was added to each resist composition as a surfactant, and as the organic solvent, a mixed solvent of 1,204 parts by mass of propylene glycol monomethyl ether acetate (PGMEA), 1,204 parts by mass of ethyl lactate (EL), and 1,606 parts by mass of propylene glycol monomethyl ether (PGME) was used.

Polymer (RP-1)

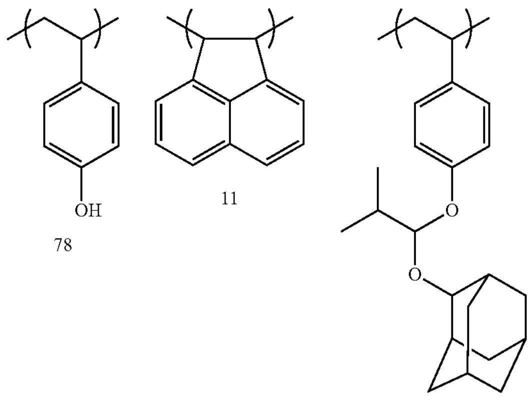

78 11 11

Polymer (RP-2)

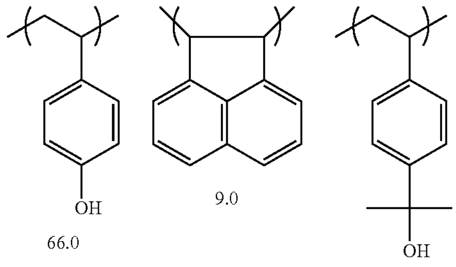

66.0 9.0 21.5

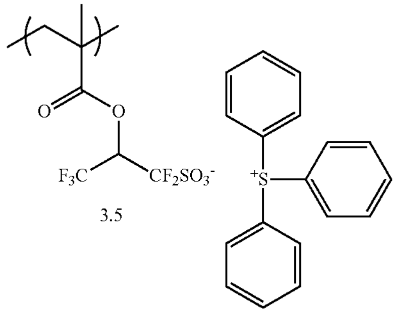

3.5

PAG (P-1)

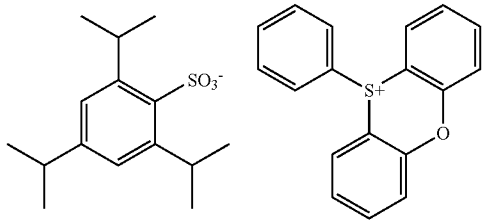

-continued

Q-1

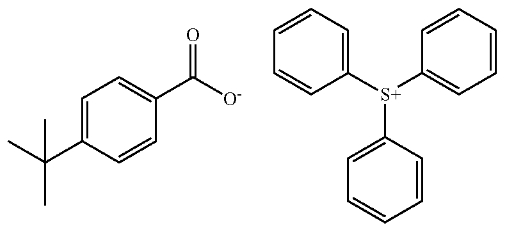

Polymer D1

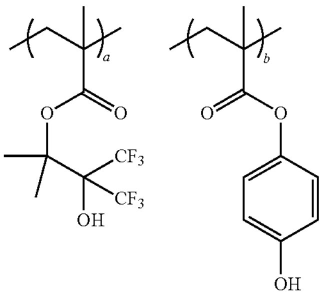

(a = 0.80, b = 0.20, Mw = 6,000)

(Electron Beam Resist and Conductive Polymer Composition—Film Formation on Silicon Wafer)

(R-1) and (R-2) were applied by spin-coating on a silicon wafer having a diameter of 6 inches (150 mm) by using a coater developer clean track MARK VIII (manufactured by Tokyo Electron Limited), and subjected to baking in a precision thermostat at 110° C. for 240 seconds and the solvent was removed to form a film. On the film, 2.0 mL of each of Examples 1 to 6 and Comparative Examples 1 to 6 was dropped respectively, and was applied by spin-coating on the whole resist film by using a spinner. The spin-coating conditions were so adjusted that the film thickness was 80±5 nm. Baking was carried out in a precision thermostat at 90° C. for 5 minutes, and the solvent was removed to obtain an antistatic film. A resist film thickness and an antistatic film thickness were determined by an incident angle-variable spectroscopic ellipsometer VASE (manufactured by J. A. Woollam Co.).

(Conductive Polymer Composition—pH Measurement)

A pH of each of the conductive polymer compositions of Examples 1 to 6 and Comparative Examples 1 to 6 was measured by using a pH meter D-52 (manufactured by Horiba Ltd.). The results are shown in Table 2.

(Conductive Polymer Composition—Volume Resistivity)

A volume resistivity (Ω·cm) of each of the conductive polymer films of Examples 1 to 6 and Comparative Examples 1 to 6 obtained by the method of forming a film by spin-coating was measured by using Loresta-GP MCP-T610 or Hiresta-UP MCP-HT450 (each manufactured by Mitsubishi Chemical Corporation). The results are shown in Table 2.

TABLE 2

| | pH | Volume resistivity (Ω · cm) |
|---|---|---|
| Example 1 | 4.44 | 5.33E+02 |
| Example 2 | 4.53 | 6.01E+02 |
| Example 3 | 4.38 | 5.73E+02 |
| Example 4 | 4.40 | 5.88E+02 |
| Example 5 | 4.90 | 1.35E+03 |
| Example 6 | 4.93 | 1.16E+03 |
| Comparative Example 1 | 6.46 | 2.34E+04 |
| Comparative Example 2 | 4.85 | 1.33E+02 |
| Comparative Example 3 | 6.22 | 8.00E+04 |
| Comparative Example 4 | 4.75 | 2.15E+02 |
| Comparative Example 5 | 6.27 | 8.88E+04 |
| Comparative Example 6 | 5.10 | 2.58E+03 |

(Evaluation of Change Rate of Resist Film Loss)

The effect of diffusion of the acid from the conductive polymer film to the resist film or diffusion of the additive to the resist film appears particularly in the film remaining after development when the positive resist is applied. Thereafter, a film of each of Examples 1 to 6 and Comparative Examples 1 to 6 was formed on the positive resist (R-1), and a change rate of film loss of the resist film was measured when a resist pattern was obtained by development through a peeling process before PEB or a peeling process after PEB of the conductive polymer composition formed into a film after the electron beam writing.

Evaluation of Peeling Process Before PEB

The positive chemically-amplified resist (R-1) was applied by spin-coating onto a 6-inch silicon wafer by using MARK VIII (manufactured by Tokyo Electron Limited, coater developer clean track), and pre-baked on a hot plate at 110° C. for 240 seconds to prepare a 80-nm resist film <film thickness (T1)>. The conductive polymer composition was applied by spin-coating onto the obtained wafer with the resist film by using MARK VIII in the same manner as above, and baked on a hot plate at 90° C. for 90 seconds to prepare a conductive polymer film having 20 nm. Further, the film was exposed using an electron beam exposure apparatus (HL-800D, manufactured by Hitachi High-Technologies Corporation, acceleration voltage 50 keV), thereafter, the conductive polymer film was peeled off by flowing pure water for 15 seconds, and then, baking at 90° C. for 240 seconds (PEB: post exposure bake) was performed and development with a 2.38 mass % aqueous solution of tetramethylammonium hydroxide was carried out to obtain a positive pattern <film thickness (T3) at unexposed portion>.

Evaluation of Peeling Process after PEB

The positive chemically-amplified resist (R-1) was applied by spin-coating onto a 6-inch silicon wafer by using MARK VIII (manufactured by Tokyo Electron Limited, coater developer clean track), and pre-baked on a hot plate at 110° C. for 240 seconds to prepare a 80-nm resist film <film thickness (T1)>. The conductive polymer composition was applied by spin-coating onto the obtained wafer with the resist film by using MARK VIII in the same manner as above, and baked on a hot plate at 90° C. for 90 seconds to prepare a 20-nm conductive polymer film. Furthermore, the film was exposed using an electron beam exposure apparatus (HL-800D, manufactured by Hitachi High-Technologies Corporation, acceleration voltage 50 keV), and then, baking at 90° C. for 240 seconds (PEB: post exposure bake) was performed, and development with a 2.38 mass % aqueous solution of tetramethylammonium hydroxide was carried out to obtain a positive pattern <film thickness (T3) at unexposed portion>.

The same operation as the peeling process after PEB was also carried out on the resist film to which no conductive polymer film was provided, and an optimum exposure amount after exposure and development and a resist film thickness (T2) at the unexposed portion were obtained, and according to the following equation, a change rate of film loss (change rate of film thickness) was obtained in each of the peeling process before PEB and the peeling process after PEB of the conductive polymer film.

Change rate of film loss (%)=[{(T1-T3)-(T1-T2)}/(T1-T2)]×100

Table 3 shows the results.

TABLE 3

| | Change rate of film loss (%) | |
|---|---|---|
| | Peeling process before PEB | Peeling process after PEB |
| Resist | (R-1) | (R-1) |
| Example 1 | 8.3 | 9.8 |
| Example 2 | 7.9 | 9.2 |
| Example 3 | 8.5 | 10.3 |
| Example 4 | 6.9 | 9.0 |
| Example 5 | 5.4 | 6.4 |
| Example 6 | 5.0 | 5.7 |
| Comparative Example 1 | 33.3 | 45.8 |
| Comparative Example 2 | 17.3 | 18.3 |
| Comparative Example 3 | 35.9 | 48.2 |
| Comparative Example 4 | 19.7 | 22.9 |
| Comparative Example 5 | 30.3 | 42.5 |
| Comparative Example 6 | 14.6 | 15.2 |

(Evaluation of Electron Beam Writing Resolution)

The effect of diffusion of the acid from the conductive polymer film to the resist film or diffusion of the additive to the resist film appears remarkably in the pattern resolution limit, pattern edge roughness, and pattern sectional profile after development of the writing on the positive resist. Thereafter, a film of each of Examples 1 to 6 and Comparative Examples 1 to 6 was formed on the positive resist (R-1), and the resolution limit, pattern edge roughness, and pattern sectional profile were evaluated when a resist pattern was obtained by development through a peeling process before PEB or a peeling process after PEB of the conductive polymer composition formed into a film after the electron beam writing.

A resist pattern was obtained through the following process from the positive resist film and conductive film formed on a mask blank.

Evaluation of Peeling Process Before PEB

The resist composition prepared as described above was applied by spin-coating onto a 152-mm square mask blank, the outermost surface of which was a chromium oxide nitride film, by using ACT-M (manufactured by Tokyo Electron Limited), and pre-baked on a hot plate at 110° C. for 600 seconds to prepare an 80-nm resist film. Measurement of the film thickness of the obtained resist film was carried out with an optical measurement apparatus Nanospec (manufactured by Nanometrics). The measurement was carried out at 81 portions in the plane of the blank substrate excluding the outer periphery from the outer edge of the blank to 10 mm inward, and an average value of the film thickness and a range of the film thickness were calculated. The conductive polymer compositions of Examples 1 to 6 and Comparative Examples 1 to 6 were respectively applied by spin-coating onto the mask blank with the resist film thus obtained, and baked on a hot plate at 90° C. for 90 seconds to prepare a 20-nm conductive polymer film. Subsequently, the film was exposed using an electron beam exposure apparatus (EBM-5000plus manufactured by NuFlare Technology Inc., acceleration voltage 50 kV), peeled by washing with ultrapure water for 20 seconds, then subjected to PEB at 110° C. for 600 seconds, and developed with a 2.38 mass % aqueous TMAH solution to obtain patterns of a positive resist (R-1).

The obtained resist pattern was evaluated as follows. The prepared mask blank with the pattern was observed with a sky SEM (scanning electron microscope). The exposure amount which resolves 1:1 line-and-space (LS) of 200 nm with 1:1 was set as the optimum exposure amount (sensitivity) ($\mu C/cm^2$), and the minimum dimension at this exposure amount was obtained as the resolution (limiting resolution). In addition, regarding an isolated line pattern (IL) of 200 nm, similarly, the exposure amount which resolves the pattern at 200 nm was set as the optimum exposure amount, and the minimum dimension at this exposure amount was obtained as the resolution (limiting resolution).

In addition, whether or not the pattern profile was rectangular was judged by SEM measurement of the 200-nm pattern edge roughness (LER) of the line-and-space (LS) and SEM observation of a cross section of the isolated line pattern. Table 4 shows results using the positive resist (R-1).

TABLE 4

| | LS limit resolution (nm) | IL limit resolution (nm) | LS edge roughness LER | IL pattern profile |
|---|---|---|---|---|
| Resist (R-1) alone | 35 | 40 | 6.1 | Rectangle |
| Example 1 | 35 | 45 | 6.2 | Rectangle |
| Example 2 | 35 | 45 | 6.0 | Rectangle |
| Example 3 | 40 | 45 | 5.8 | Rectangle |
| Example 4 | 40 | 45 | 5.5 | Rectangle |
| Example 5 | 35 | 40 | 5.2 | Rectangle |
| Example 6 | 35 | 40 | 5.5 | Rectangle |
| Comparative Example 1 | 80 | 150 | 4.9 | Top rounding |
| Comparative Example 2 | 40 | 120 | 5.8 | Top rounding |
| Comparative Example 3 | 100 | 150 | 4.6 | Top rounding |
| Comparative Example 4 | 40 | 120 | 5.5 | Top rounding |
| Comparative Example 5 | 100 | 150 | 5.4 | Top rounding |
| Comparative Example 6 | 40 | 100 | 5.7 | Top rounding |

Evaluation of Peeling Process after PEB

The resist composition prepared as described above was applied by spin-coating onto a 152-mm square mask blank, the outermost surface of which was a chromium oxide nitride film by using ACT-M (manufactured by Tokyo Electron Limited), and pre-baked on a hot plate at 110° C. for 600 seconds to prepare an 80-nm resist film. Measurement of the film thickness of the obtained resist film was carried out with an optical measurement apparatus Nanospec (manufactured by Nanometrics). The measurement was carried out at 81 portions in the plane of the blank substrate excluding the outer periphery from the outer edge of the blank to 10 mm inward, and an average value of the film thickness and a range of the film thickness were calculated. The conductive polymer compositions of Examples 1 to 6 and Comparative Examples 1 to 6 were respectively applied by spin-coating onto the mask blank with the resist film thus obtained, and baked on a hot plate at 90° C. for 90 seconds to prepare a 20-nm conductive polymer film. Subsequently, the film was exposed using an electron beam exposure apparatus (EBM-5000plus manufactured by NuFlare Technology Inc., acceleration voltage 50 kV), then subjected to PEB at 110° C. for 600 seconds, and developed with a 2.38 mass % aqueous TMAH solution to obtain patterns of a positive resist (R-1).

The obtained resist pattern was evaluated as follows. The prepared mask blank with the pattern was observed with a sky SEM (scanning electron microscope). The exposure amount which resolves 1:1 line-and-space (LS) of 200 nm with 1:1 was set as the optimum exposure amount (sensitivity) ($\mu C/cm^2$), and the minimum dimension at this exposure amount was obtained as the resolution (limiting resolution). In addition, regarding an isolated line pattern (IL) of 200 nm, similarly, the exposure amount which resolves the pattern at 200 nm was set as the optimum exposure amount, and the minimum dimension at this exposure amount was obtained as the resolution (limiting resolution). In addition, whether or not the pattern profile was rectangular was judged by SEM measurement of the pattern edge roughness (LER) of the line-and-space pattern (LS) having a line width of 200 nm and SEM observation of a cross section of the isolated line pattern (IL). Table 5 shows results using the positive resist (R-1).

TABLE 5

| | LS limit resolution (nm) | IL limit resolution (nm) | LS edge roughness LER | IL pattern profile |
|---|---|---|---|---|
| Resist (R-1) alone | 35 | 40 | 6.1 | Rectangle |
| Example 1 | 35 | 45 | 6.0 | Rectangle |
| Example 2 | 35 | 40 | 5.9 | Rectangle |
| Example 3 | 40 | 45 | 5.9 | Rectangle |
| Example 4 | 40 | 40 | 5.8 | Rectangle |
| Example 5 | 35 | 40 | 6.0 | Rectangle |
| Example 6 | 35 | 40 | 6.2 | Rectangle |
| Comparative Example 1 | 120 | >200 | 4.2 | Top rounding |
| Comparative Example 2 | 80 | >200 | 5.0 | Top rounding |
| Comparative Example 3 | 120 | >200 | 4.0 | Top rounding |
| Comparative Example 4 | 80 | >200 | 5.1 | Top rounding |
| Comparative Example 5 | 100 | >200 | 4.5 | Top rounding |
| Comparative Example 6 | 60 | >200 | 5.2 | Top rounding |

In Examples 1 to 6 in Table 2, a polymer containing at least one kind of an acetate having the structure represented by the general formula (2), specifically, PAS-M-1A and PAA-D19A available from NITTOBO MEDICAL CO., LTD. was added as component (B) to the component (A) polyaniline-based polymer compound to form the conductive polymer composition. Therefore, the component (B) caused an ion-exchange action in a sulfonic acid terminal of the component (A), so that the pH was in a weak acid region of 4.38 to 4.93. In Comparative Examples 1, 3, and 5, the component (B) is a substance that shows strong basicity, and therefore, causes a neutralizing action in a sulfonic acid terminal of the component (A), so that pH was in a higher region to be around neutral. Meanwhile, Comparative Examples 2, 4, and 6 are acetate monomers, and therefore, cause an ion-exchange action in a sulfonic acid terminal of the component (A) in the same manner as the PAS-M-1A and the PAA-D19A, so that the pH was in a weak acid region of 4.75 to 5.10. This result is an evaluation of the liquid property before forming a film, and does not show directly the effect on the resist when a film is formed on an upper layer of the resist for use as an antistatic film at the time of electron beam resist writing. Therefore, the effectiveness of the Examples compared with the Comparative Examples is unclear. However, a clear difference is exhibited in lithography when these conductive polymer compositions are respectively applied onto an electron beam resist to form a film and go through electron beam writing and PEB processes.

When (B) contains an acetate, de-doping of sulfo groups concerned with intramolecular-doping of the component (A) is not promoted, and conductivity is maintained so that the volume resistivity shows an order of magnitude of E+02 to E+03 Ω·cm. On the contrary, if the component (B) is a material that shows a strong basicity, e.g. a hydroxide salt, de-doping of sulfo groups concerned with intramolecular-doping of the component (A) occurs, so that the volume resistivity shows a somewhat high order of magnitude of E+04 Ω·cm. In Examples 1 to 6 and Comparative Examples 2, 4, and 6, the volume resistivity (Ω·cm) of the conductive polymer film showed a value at which antistatic function can be exhibited sufficiently. However, in Comparative Examples 1, 3, and 5, the volume resistivity (Ω·cm) showed a large value, at which sufficient antistatic function cannot be exhibited.

In Table 3, each of Examples 1 to 6 and Comparative Examples 1 to 6 were respectively formed into a film on a positive electron beam resist (R-1), and the film loss rate was compared based on the lithography results obtained by resist pattern development through a peeling process before resist PEB, or by collective peeling at the time of resist pattern development after the resist PEB. In Examples 1 to 6, the film loss rate of the resist was about 5 to 10% for any of the above resist types and after any peeling process. However, in Comparative Examples 1, 3, and 5, the film loss rate was extremely high and was about 30% to 48%, and in Comparative Examples 2, 4, and 6, about 15 to 23%. While the component (B) in Examples 1 to 6 had little effect of the chemical reaction on the diffusion to the electron beam resist and the respective constitutional elements, the component showing strong basicity contained in Comparative Examples 1, 3, and 5 caused not only neutralization of the acid, but also diffused to the electron beam resist layer and caused nucleophilic attack on the constitutional elements of the resist and so forth, and this altered the function of the resist. In addition, in Comparative Examples 2, 4, and 6, the carboxylate itself diffused to the electron beam resist layer, so that the ability to control the diffusion of acid originating from polyaniline was degraded due to the proportion of carboxylate present in the conductive polymer composition being reduced. Thus, the resist film loss rate after the development was high.

In Tables 4 and 5, each of Examples 1 to 6 and Comparative Examples 1 to 6 were respectively formed into a film on a positive electron beam resist (R-1), and the limiting resolution and edge roughness (LER) of the LS patterns and the limiting resolution and pattern sectional profile of the IL patterns were compared under the optimum exposure amount at which a pattern width of 200 nm is achieved on the basis of the lithography results obtained by resist pattern development through a peeling process before PEB and PEB, or collective resist pattern development after PEB without a peeling process before PEB. In Examples 1 to 6, in all of the above resist patterns, the limiting resolution and edge roughness (LER) were equivalent to those in lithography in which a resist alone was used with no conductive polymer composition applied. In addition, the cross-sectional profile of the IL pattern after development did not lose resist properties, and maintained a rectangular profile. On the other hand, in Comparative Examples 1, 3, and 5, as described above, the effect of the chemical reaction on the constitutional elements of the electron beam resist was great, and the substance showing strong basicity caused not only neutralization of the acid in the conductive polymer composition, but also caused nucleophilic attack on the constitutional elements of the electron beam resist after film formation, and so forth. This exerted an effect on the sensitivity of the electron beam resist and the lithography properties. In addition, in Comparative Examples 2, 4, and 6, the LS and IL pattern resolution, edge roughness (LER) of the LS pattern, and cross-sectional profile of the IL pattern were degraded in each case due to the reduction in the proportion of carboxylate present in the conductive composition film.

(Evaluation of Electron Beam Lithography and Evaluation of PCD (Post Coating Delay))

Next, change with a lapse of time due to the effect of the conductive polymer film on the resist film before irradiation with the electron beam was measured. The two-layered film of the resist film and the conductive polymer film provided by coating according to the method described below was allowed to stand immediately after film formation for 7 days, 14 days, and 30 days in the electron beam writing apparatus, and then, a resist pattern was obtained by the peeling process before PEB or the peeling process after PEB of the conductive polymer film as described below. Change in the pattern line width at the sensitivity when the resist and conductive polymer films were drawn immediately after film formation was obtained.

Evaluation of Peeling Process Before PEB

The positive chemically-amplified resist (R-1) was applied by spin-coating on a 6-inch silicon wafer by using MARK VIII (manufactured by Tokyo Electron Limited, coater developer clean track), and subjected to pre-baking on a hot plate at 110° C. for 240 seconds to obtain a resist film having a film thickness of 80 nm. The conductive polymer composition was applied by spin-coating onto the obtained wafer with the resist film in the same manner as above by using MARK VIII, and baked on a hot plate at 90° C. for 90 seconds to prepare a conductive polymer film. With regard to the wafer onto which the two-layered film of the resist film and the conductive polymer film had been provided by coating, resist patterns were obtained immediately after being provided by coating, after 7 days, after 14 days, and after 30 days, respectively, by the following methods. First, with regard to the wafer immediately after being provided by coating, it was exposed by using an electron beam exposure apparatus (HL-800D, manufactured by Hitachi High-Technologies Corporation, acceleration voltage 50 keV), thereafter, the conductive polymer film was peeled off by flowing pure water for 20 seconds, and then, the resultant was subjected to baking at 110° C. for 240 seconds (PEB: post exposure bake) and developed with a 2.38 mass % aqueous tetramethylammonium hydroxide solution. The prepared wafer with the pattern was observed with a sky SEM (scanning electron microscope), and an exposure amount which resolves line-and-space of 400 nm with 1:1 was set as an optimum exposure amount (sensitivity) (μC/cm$^2$). A minimum dimension at the optimum exposure amount was set as a resolution. In addition, with regard to the wafers after 7 days, 14 days, and 30 days had passed after being provided by coating, resist patterns were similarly obtained, and change in the pattern line width at the exposure amount (optimum exposure amount (sensitivity) (μC/cm$^2$)) which resolves line-and-space of 200 nm with 1:1 in the wafer immediately after being provided by coating was measured. The results are shown in Table 6.

Evaluation of Peeling Process after PEB

In the same manner as in the peeling process before PEB, wafers onto which the two-layered film of the resist film and the conductive polymer film had been provided by coating were prepared, and with regard to the respective wafers after 7 days, 14 days, and 30 days had passed after being provided by coating, they were subjected to baking at 110° C. for 240 seconds (PEB: post exposure bake) without subjecting to the process of peeling the conductive polymer film by flowing pure water for 20 seconds after the electron beam exposure, and developed with a 2.38 mass % aqueous tetramethylammonium hydroxide solution to obtain a resist pattern. Change in the pattern line width at the exposure amount (optimum exposure amount (sensitivity) (μC/cm$^2$)) which resolves line-and-space of 200 nm with 1:1 in the wafer immediately after being provided by coating was measured. The results are shown in Table 7.

TABLE 6

Positive resist (R-1) peeling process before PEB, PCD

| | PCD line width variation (nm) | | | |
|---|---|---|---|---|
| | Immediately after coating | 7 days | 14 days | 30 days |
| Example 1 | 0 | −0.2 | −0.5 | −1.0 |
| Example 2 | 0 | −0.2 | −0.6 | −1.1 |
| Example 3 | 0 | −0.3 | −0.6 | −1.2 |
| Example 4 | 0 | −0.2 | −0.5 | −1.1 |
| Example 5 | 0 | −0.1 | −0.5 | −1.2 |
| Example 6 | 0 | −0.2 | −0.5 | −1.0 |
| Comparative Example 1 | 0 | −5.9 | −12.2 | −18.8 |
| Comparative Example 2 | 0 | −0.6 | −0.8 | −1.8 |
| Comparative Example 3 | 0 | −6.0 | −12.2 | −20.1 |
| Comparative Example 4 | 0 | −0.6 | −0.8 | −1.7 |
| Comparative Example 5 | 0 | −5.2 | −9.9 | −18.2 |
| Comparative Example 6 | 0 | −0.5 | −0.7 | −1.9 |

TABLE 7

Positive resist (R-1) peeling process after PEB, PCD

| | PCD line width variation (nm) | | | |
|---|---|---|---|---|
| | Immediately after coating | 7 days | 14 days | 30 days |
| Example 1 | 0 | −0.3 | −0.5 | −1.3 |
| Example 2 | 0 | −0.3 | −0.4 | −1.2 |
| Example 3 | 0 | −0.4 | −0.6 | −1.5 |
| Example 4 | 0 | −0.3 | −0.6 | −1.7 |
| Example 5 | 0 | −0.3 | −0.5 | −1.2 |
| Example 6 | 0 | −0.2 | −0.4 | −1.1 |
| Comparative Example 1 | 0 | −7.0 | −12.5 | −23.6 |
| Comparative Example 2 | 0 | −0.8 | −1.4 | −2.4 |
| Comparative Example 3 | 0 | −7.2 | −14.7 | −24.2 |
| Comparative Example 4 | 0 | −0.9 | −2.0 | −2.5 |
| Comparative Example 5 | 0 | −7.9 | −15.3 | −23.7 |

TABLE 7-continued

Positive resist (R-1) peeling process after PEB, PCD

| | PCD line width variation (nm) | | | |
|---|---|---|---|---|
| | Immediately after coating | 7 days | 14 days | 30 days |
| Comparative Example 6 | 0 | −0.8 | −1.3 | −2.3 |

With regard to the negative resist (R-2), the same evaluation as the above-described positive resist (R-1) was carried out for the peeling process before PEB and the peeling process after PEB. The results are shown in Table 8 and Table 9.

TABLE 8

Negative resist (R-2) peeling process before PEB, PCD

| | PCD line width variation (nm) | | | |
|---|---|---|---|---|
| | Immediately after coating | 7 days | 14 days | 30 days |
| Example 1 | 0 | 0.3 | 0.5 | 1.0 |
| Example 2 | 0 | 0.3 | 0.6 | 1.1 |
| Example 3 | 0 | 0.3 | 0.5 | 1.3 |
| Example 4 | 0 | 0.4 | 0.7 | 1.3 |
| Example 5 | 0 | 0.2 | 0.4 | 0.9 |
| Example 6 | 0 | 0.2 | 0.4 | 0.9 |
| Comparative Example 1 | 0 | 6.1 | 14.4 | 25.2 |
| Comparative Example 2 | 0 | 0.7 | 1.0 | 2.1 |
| Comparative Example 3 | 0 | 6.3 | 15.2 | 25.4 |
| Comparative Example 4 | 0 | 0.7 | 1.1 | 2.2 |
| Comparative Example 5 | 0 | 6.0 | 13.8 | 24.6 |
| Comparative Example 6 | 0 | 0.5 | 0.8 | 1.9 |

TABLE 9

Negative resist (R-2) peeling process after PEB, PCD

| | PCD line width variation (nm) | | | |
|---|---|---|---|---|
| | Immediately after coating | 7 days | 14 days | 30 days |
| Example 1 | 0 | 0.4 | 0.6 | 1.3 |
| Example 2 | 0 | 0.4 | 0.5 | 1.3 |
| Example 3 | 0 | 0.5 | 0.7 | 1.5 |
| Example 4 | 0 | 0.6 | 0.6 | 1.4 |
| Example 5 | 0 | 0.4 | 0.5 | 1.1 |
| Example 6 | 0 | 0.3 | 0.4 | 1.1 |
| Comparative Example 1 | 0 | 7.8 | 16.8 | 28.3 |
| Comparative Example 2 | 0 | 0.9 | 1.3 | 2.5 |
| Comparative Example 3 | 0 | 8.3 | 17.1 | 29.0 |
| Comparative Example 4 | 0 | 1.1 | 1.4 | 2.7 |
| Comparative Example 5 | 0 | 7.6 | 16.0 | 24.3 |
| Comparative Example 6 | 0 | 0.8 | 1.2 | 2.3 |

As shown in Tables 6 to 9, in the evaluation of the PCD (Post Coating Delay), in the compositions of Examples 1 to 6 having the effect of suppressing influence of the acid from the conductive polymer film to the electron beam resist layer, storage stability of the resist film was successfully maintained good even after forming the films as the conductive film on the resist upper layer. That is, this suggests that, in a covered material of the resist film and the conductive polymer film (antistatic film) thereon before the electron beam writing, in the processes of the writing and peeling of the conductive polymer film (antistatic film), and pattern development, good lithographic results can be obtained by suppressing diffusion of the acid from the conductive polymer film. On the other hand, the compositions of Comparative Examples 1, 3, and 5 have high relaxing (neutralization) efficiency of the acidity of the composition and show liquid property near to neutral by the addition of a strongly basic substance to the composition, but after film formation, the unreacted part of the strongly basic substance gradually diffuses to the electron beam resist layer, and due to nucleophilic attack to the constitutional elements of the resist, a side reaction occurs in which acid is generated from the acid generator before the writing. This adversely affects lithography due to the generation of acid that is already excessive during substrate storage, a concentration gradient of the acid occurring in the layer during irradiation with the electron beam, and so forth. Meanwhile, in the compositions of Comparative Examples 2, 4, and 6, the monomolecular carboxylate in the conductive composition film diffuses to the resist layer gradually during substrate storage, so that the amount actually necessary for controlling the diffusion of the acid originating from the polyaniline in the conductive composition film to the resist layer becomes insufficient. Thus, the acid originating from the polyaniline exerts an adverse effect on lithography of the resist. The adverse effect on the resist layer in these Comparative Examples is greater the longer the time taken to form a film of the conductive polymer composition on the resist upper layer, and the effect is great even in a peeling process before PEB.

As described above, when the inventive conductive polymer composition is employed, it is possible to form an antistatic film having excellent antistatic property at the time of writing to the electron beam resist and minimizing the effect of the acid to the resist as much as possible. The composition having such conductivity and capable of preventing the effect of the acid is also effective as a constitutional film of an organic thin film device, and when the composition suppresses the effect of the acid to the adjacent layer and has functions such as conductivity and carrier transfer medium and the like in the laminated structure, the composition can also be suitably used as a device constituting material.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A conductive polymer composition for an antistatic film for electron beam resist writing, the conductive polymer composition comprising:

(A) a polyaniline-based conductive polymer having at least one kind of a repeating unit represented by the following general formula (1); and (B) a polymer containing at least one kind of an addition salt structure represented by the following general formula (2), (1)

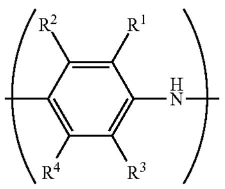

wherein $R^1$ to $R^4$ each independently represent a hydrogen atom, an acidic group, a hydroxy group, an alkoxy group, a carboxy group, a nitro group, a halogen atom, a linear alkyl group having 1 to 24 carbon atoms, a branched alkyl group having 3 to 24 carbon atoms, a linear hydrocarbon group having 1 to 24 carbon atoms containing a hetero atom, a branched or cyclic hydrocarbon group having 3 to 24 carbon atoms containing a hetero atom, a linear hydrocarbon group having 1 to 24 carbon atoms partially substituted with a halogen atom, or a branched or cyclic hydrocarbon group having 3 to 24 carbon atoms partially substituted with a halogen atom, (2)

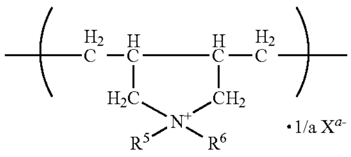

wherein $R^5$ and $R^6$ each independently represent a hydrogen atom, a linear alkyl group having 1 to 10 carbon atoms, a branched or cyclic alkyl group having 3 to 10 carbon atoms, a linear hydrocarbon group having 1 to 24 carbon atoms containing a hetero atom, or a branched or cyclic hydrocarbon group having 3 to 24 carbon atoms containing a hetero atom, $X^{a-}$ represents an anion, and "a" represents a valence.

2. The conductive polymer composition according to claim 1, wherein the acidic group in the general formula (1) is a sulfo group.

3. The conductive polymer composition according to claim 1, wherein the anion represented by $X^{a-}$ is a carboxylic acid ion in the structure represented by the general formula (2).

4. The conductive polymer composition according to claim 2, wherein the anion represented by $X^{a-}$ is a carboxylic acid ion in the structure represented by the general formula (2).

5. The conductive polymer composition according to claim 1, wherein the component (B) is contained in an amount of 1 part by mass to 200 parts by mass based on 100 parts by mass of the component (A).

6. The conductive polymer composition according to claim 2, wherein the component (B) is contained in an amount of 1 part by mass to 200 parts by mass based on 100 parts by mass of the component (A).

7. The conductive polymer composition according to claim 3, wherein the component (B) is contained in an amount of 1 part by mass to 200 parts by mass based on 100 parts by mass of the component (A).

8. The conductive polymer composition according to claim 4, wherein the component (B) is contained in an amount of 1 part by mass to 200 parts by mass based on 100 parts by mass of the component (A).

9. The conductive polymer composition according to claim 1, further comprising (C) a nonionic surfactant.

10. The conductive polymer composition according to claim 2, further comprising (C) a nonionic surfactant.

11. The conductive polymer composition according to claim 3, further comprising (C) a nonionic surfactant.

12. The conductive polymer composition according to claim 4, further comprising (C) a nonionic surfactant.

13. The conductive polymer composition according to claim 9, wherein the component (C) is contained in an amount of 0.1 parts by mass to 10 parts by mass based on 100 parts by mass of the component (A).

14. The conductive polymer composition according to claim 1, further comprising (D) a water-soluble polymer.

15. The conductive polymer composition according to claim 14, wherein the component (D) is contained in an amount of 30 parts by mass to 150 parts by mass based on 100 parts by mass of the component (A).

16. A coated product comprising a film of the conductive polymer composition according to claim 1 formed on a body to be processed.

17. The coated product according to claim 16, wherein the body to be processed is a substrate comprising a chemically-amplified resist film.

18. The coated product according to claim 17, wherein the body to be processed is a substrate for obtaining a resist pattern by pattern irradiation using an electron beam.

19. The coated product according to claim 18, wherein the body to be processed is a substrate comprising a chemically-amplified electron beam resist film having a sensitivity of 20 $\mu C/cm^2$ or more.

20. A patterning process comprising the steps of:

(1) forming an antistatic film on a resist film of a substrate provided with a chemically-amplified resist film by using the conductive polymer composition according to claim 1;

(2) performing pattern irradiation by using an electron beam; and (3) developing the substrate by using $H_2O$ or an alkaline developer to obtain a resist pattern.

* * * * *